US009240530B2

(12) United States Patent
Reiherzer

(10) Patent No.: US 9,240,530 B2
(45) Date of Patent: Jan. 19, 2016

(54) LIGHT EMITTER DEVICES HAVING IMPROVED CHEMICAL AND PHYSICAL RESISTANCE AND RELATED METHODS

(75) Inventor: Jesse Colin Reiherzer, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 446 days.

(21) Appl. No.: 13/444,394

(22) Filed: Apr. 11, 2012

(65) Prior Publication Data

US 2013/0207142 A1 Aug. 15, 2013

Related U.S. Application Data

(63) Continuation-in-part of application No. 13/372,063, filed on Feb. 13, 2012, now Pat. No. 8,957,580, and a continuation-in-part of application No. 13/372,076, filed on Feb. 13, 2012, now Pat. No. 8,946,747.

(51) Int. Cl.
*H01L 33/50* (2010.01)
*H01L 33/54* (2010.01)
*H01L 25/075* (2006.01)

(52) U.S. Cl.
CPC ........... *H01L 33/507* (2013.01); *H01L 25/0753* (2013.01); *H01L 33/504* (2013.01); *H01L 33/54* (2013.01); *H01L 2224/48091* (2013.01); *H01L 2224/48137* (2013.01); *H01L 2224/48247* (2013.01); *H01L 2933/0033* (2013.01)

(58) Field of Classification Search
CPC . H01L 33/52; H01L 2933/0025; H01L 33/56; H01L 33/502; H01L 33/504; H01L 33/44

USPC .................................. 438/27, 29, 116; 257/98
See application file for complete search history.

(56) References Cited

U.S. PATENT DOCUMENTS

| 3,288,728 | A | 11/1966 | Gorham |
|---|---|---|---|
| 3,875,456 | A | 4/1975 | Kano et al. |
| H445 | H | 3/1988 | Bock et al. |
| 4,918,497 | A | 4/1990 | Edmond |
| 4,946,547 | A | 8/1990 | Palmour |

(Continued)

FOREIGN PATENT DOCUMENTS

| EP | 1536487 | 6/2005 |
|---|---|---|
| EP | 2056363 A2 | 5/2009 |

(Continued)

OTHER PUBLICATIONS

Restriction Requirement for U.S. Appl. No. 13/554,769 dated Oct. 9, 2013.

(Continued)

*Primary Examiner* — George Fourson, III
(74) *Attorney, Agent, or Firm* — Jenkins, Wilson, Taylor & Hunt, P.A.

(57) ABSTRACT

Light emitter devices having improved chemical and physical resistance and related methods are disclosed herein. In one embodiment, the light emitter device includes a light emission area with a cavity with one or more light emitting chips disposed within the cavity. The device can further include a filling material at least partially disposed over the one or more light emitting chips. The filling material can include a first discrete layer of phosphor containing material and a second discrete clear barrier layer. The clear barrier layer can include a layer of glass.

54 Claims, 7 Drawing Sheets

(56) References Cited

U.S. PATENT DOCUMENTS

| | | | |
|---|---|---|---|
| 4,966,862 A | 10/1990 | Edmond | |
| 5,027,168 A | 6/1991 | Edmond | |
| 5,200,022 A | 4/1993 | Kong | |
| 5,210,051 A | 5/1993 | Carter, Jr. | |
| 5,338,944 A | 8/1994 | Edmond | |
| 5,359,345 A | 10/1994 | Hunter | |
| RE34,861 E | 2/1995 | Davis | |
| 5,393,993 A | 2/1995 | Edmond | |
| 5,416,342 A | 5/1995 | Edmond | |
| 5,523,589 A | 6/1996 | Edmond | |
| 5,604,135 A | 2/1997 | Edmond | |
| 5,631,190 A | 5/1997 | Negley | |
| 5,739,554 A | 4/1998 | Edmond | |
| 5,912,477 A | 6/1999 | Negley | |
| 5,959,316 A | 9/1999 | Lowery | |
| 6,120,600 A | 9/2000 | Edmond | |
| 6,121,637 A | 9/2000 | Isokawa et al. | |
| 6,187,606 B1 | 2/2001 | Edmond | |
| 6,201,262 B1 | 3/2001 | Edmond | |
| 6,252,254 B1 | 6/2001 | Soules et al. | |
| 6,350,041 B1 | 2/2002 | Tarsa et al. | |
| 6,576,930 B2 | 6/2003 | Reeh et al. | |
| 6,600,175 B1 | 7/2003 | Baretz | |
| 6,717,353 B1 | 4/2004 | Mueller et al. | |
| 6,791,119 B2 | 9/2004 | Slater, Jr. | |
| 6,853,010 B2 | 2/2005 | Slater, Jr. | |
| 6,860,621 B2 | 3/2005 | Bachl et al. | |
| 6,936,857 B2 | 8/2005 | Doxsee et al. | |
| 6,958,497 B2 | 10/2005 | Emerson | |
| 7,005,679 B2 | 2/2006 | Tarsa et al. | |
| 7,087,936 B2 | 8/2006 | Negley | |
| 7,095,056 B2 | 8/2006 | Vitta | |
| 7,183,577 B2 | 2/2007 | Mueller-Mach | |
| 7,211,835 B2 | 5/2007 | Ono | |
| 7,213,940 B1 | 5/2007 | Van De Ven | |
| 7,244,965 B2 | 7/2007 | Andrews et al. | |
| 7,246,930 B2* | 7/2007 | Yatsuda et al. | 362/539 |
| 7,250,715 B2 | 7/2007 | Mueller et al. | |
| 7,304,326 B2* | 12/2007 | Suehiro et al. | 257/79 |
| 7,344,902 B2* | 3/2008 | Basin et al. | 438/27 |
| 7,456,499 B2 | 11/2008 | Loh | |
| 7,476,909 B2 | 1/2009 | Nagai et al. | |
| 7,534,635 B1 | 5/2009 | Foust et al. | |
| 7,564,180 B2 | 7/2009 | Brandes | |
| 7,598,669 B2 | 10/2009 | Toguchi et al. | |
| 7,638,811 B2 | 12/2009 | Slater | |
| 7,655,957 B2 | 2/2010 | Loh | |
| 7,709,853 B2 | 5/2010 | Medendorp | |
| 7,791,061 B2 | 9/2010 | Edmond et al. | |
| 7,821,023 B2 | 10/2010 | Yuan et al. | |
| 7,825,575 B2* | 11/2010 | Sawanobori et al. | 313/498 |
| 7,833,073 B2 | 11/2010 | Ogawa | |
| 7,842,526 B2* | 11/2010 | Hadame et al. | 438/29 |
| 7,868,343 B2 | 1/2011 | Negley | |
| 7,952,115 B2 | 5/2011 | Loh | |
| 8,011,818 B2 | 9/2011 | Negley | |
| 8,052,307 B2 | 11/2011 | Bak et al. | |
| 8,058,088 B2 | 11/2011 | Cannon | |
| 8,858,022 B2 | 10/2014 | Jiang et al. | |
| 2002/0004577 A1 | 1/2002 | Biebuyck et al. | |
| 2003/0067761 A1 | 4/2003 | Horiuchi et al. | |
| 2004/0069993 A1 | 4/2004 | Murano | |
| 2004/0079957 A1 | 4/2004 | Andrews et al. | |
| 2005/0045898 A1 | 3/2005 | Leu et al. | |
| 2005/0093430 A1 | 5/2005 | Ibbetson et al. | |
| 2005/0159581 A1 | 7/2005 | Vanderzande et al. | |
| 2005/0224830 A1 | 10/2005 | Blonder et al. | |
| 2006/0091415 A1 | 5/2006 | Yan | |
| 2006/0124953 A1* | 6/2006 | Negley et al. | 257/99 |
| 2006/0145172 A1 | 7/2006 | Se et al. | |
| 2006/0163589 A1 | 7/2006 | Fan et al. | |
| 2006/0181866 A1 | 8/2006 | Jung et al. | |
| 2006/0186418 A1 | 8/2006 | Edmond | |
| 2006/0221272 A1 | 10/2006 | Negley | |
| 2006/0226759 A1 | 10/2006 | Masuda et al. | |
| 2007/0012940 A1 | 1/2007 | Suh et al. | |
| 2007/0090383 A1* | 4/2007 | Ota et al. | 257/98 |
| 2007/0139923 A1 | 6/2007 | Negley | |
| 2007/0158668 A1 | 7/2007 | Tarsa | |
| 2007/0170447 A1 | 7/2007 | Negley | |
| 2007/0223219 A1 | 9/2007 | Medendorp et al. | |
| 2007/0228387 A1 | 10/2007 | Negley et al. | |
| 2007/0253209 A1 | 11/2007 | Loh | |
| 2007/0268694 A1 | 11/2007 | Bailey et al. | |
| 2008/0012036 A1 | 1/2008 | Loh | |
| 2008/0080165 A1 | 4/2008 | Kim et al. | |
| 2008/0081065 A1 | 4/2008 | Bulavin | |
| 2008/0121921 A1 | 5/2008 | Loh | |
| 2008/0173884 A1 | 7/2008 | Chitnis | |
| 2008/0179611 A1 | 7/2008 | Chitnis | |
| 2008/0198112 A1 | 8/2008 | Roberts | |
| 2008/0237616 A1 | 10/2008 | Hatakoshi et al. | |
| 2008/0239724 A1* | 10/2008 | Moriyama et al. | 362/296 |
| 2008/0258130 A1 | 10/2008 | Bergmann | |
| 2008/0303052 A1 | 12/2008 | Lee et al. | |
| 2008/0308825 A1 | 12/2008 | Chakraborty | |
| 2009/0039375 A1 | 2/2009 | LeToquin | |
| 2009/0050907 A1 | 2/2009 | Yuan | |
| 2009/0050908 A1 | 2/2009 | Yuan | |
| 2009/0050924 A1 | 2/2009 | Edmond | |
| 2009/0065792 A1 | 3/2009 | Thompson et al. | |
| 2009/0080185 A1 | 3/2009 | McMillan | |
| 2009/0108281 A1 | 4/2009 | Keller et al. | |
| 2009/0179213 A1 | 7/2009 | Cannon | |
| 2009/0184616 A1 | 7/2009 | Van De Ven | |
| 2009/0194782 A1 | 8/2009 | Hata et al. | |
| 2009/0212316 A1 | 8/2009 | Braune et al. | |
| 2009/0231833 A1 | 9/2009 | Miki et al. | |
| 2009/0236621 A1 | 9/2009 | Chakraborty | |
| 2009/0236759 A1 | 9/2009 | Kashiwagi | |
| 2009/0250714 A1 | 10/2009 | Yun et al. | |
| 2009/0261374 A1 | 10/2009 | Hayashi | |
| 2009/0283779 A1 | 11/2009 | Negley et al. | |
| 2009/0295265 A1 | 12/2009 | Tabuchi et al. | |
| 2009/0309116 A1 | 12/2009 | Kato et al. | |
| 2009/0315057 A1 | 12/2009 | Konishi et al. | |
| 2010/0025709 A1* | 2/2010 | Koseki et al. | 257/98 |
| 2010/0102344 A1* | 4/2010 | Ueji | 257/98 |
| 2010/0103660 A1 | 4/2010 | Van de Ven et al. | |
| 2010/0133556 A1* | 6/2010 | Li et al. | 257/88 |
| 2010/0155763 A1* | 6/2010 | Donofrio et al. | 257/98 |
| 2010/0200874 A1* | 8/2010 | Shioi et al. | 257/91 |
| 2010/0203657 A1 | 8/2010 | Kim | |
| 2010/0213502 A1 | 8/2010 | Kashiwagi et al. | |
| 2010/0226130 A1 | 9/2010 | Cheng et al. | |
| 2010/0237375 A1 | 9/2010 | Yamazaki et al. | |
| 2010/0252851 A1 | 10/2010 | Emerson et al. | |
| 2010/0258830 A1 | 10/2010 | Ide et al. | |
| 2010/0283381 A1* | 11/2010 | Takahashi et al. | 313/503 |
| 2010/0289395 A1 | 11/2010 | Sun et al. | |
| 2011/0001148 A1* | 1/2011 | Sun et al. | 257/88 |
| 2011/0031513 A1 | 2/2011 | Hsieh et al. | |
| 2011/0046319 A1 | 2/2011 | Ueno et al. | |
| 2011/0204398 A1 | 8/2011 | Tanida et al. | |
| 2011/0220920 A1 | 9/2011 | Collins | |
| 2011/0220929 A1 | 9/2011 | Collins et al. | |
| 2011/0220939 A1 | 9/2011 | Nakayama | |
| 2011/0242806 A1* | 10/2011 | Ramer et al. | 362/235 |
| 2011/0248289 A1 | 10/2011 | Hsieh et al. | |
| 2011/0253429 A1 | 10/2011 | Humphries et al. | |
| 2011/0272721 A1 | 11/2011 | Butterworth | |
| 2012/0126257 A1 | 5/2012 | Reiherzer et al. | |
| 2012/0161621 A1 | 6/2012 | Sato | |
| 2012/0193649 A1 | 8/2012 | Donofrio | |
| 2012/0193660 A1 | 8/2012 | Donofrio | |
| 2013/0020590 A1 | 1/2013 | Lin | |
| 2013/0141905 A1 | 6/2013 | Hussell | |
| 2013/0141920 A1 | 6/2013 | Emerson | |
| 2013/0161650 A1 | 6/2013 | Lin | |
| 2013/0168719 A1 | 7/2013 | Watkins et al. | |
| 2013/0207130 A1 | 8/2013 | Reiherzer | |
| 2013/0207141 A1 | 8/2013 | Reiherzer | |

(56) References Cited

U.S. PATENT DOCUMENTS

| | | | |
|---|---|---|---|
| 2013/0208442 A1 | 8/2013 | Reiherzer | |
| 2013/0214298 A1 | 8/2013 | Lin | |

FOREIGN PATENT DOCUMENTS

| | | |
|---|---|---|
| EP | 2365549 A1 | 9/2011 |
| EP | 2786429 | 10/2014 |
| EP | 2791982 | 10/2014 |
| EP | 2791984 | 10/2014 |
| JP | S58 67077 A | 4/1983 |
| JP | 2001-291406 | 10/2001 |
| JP | 2003-243704 A | 8/2003 |
| JP | 2005-244226 | 9/2005 |
| JP | 2006-054209 A | 2/2006 |
| JP | 2006-245443 | 9/2006 |
| JP | 2007-266343 A | 10/2007 |
| JP | 2009-111395 | 5/2009 |
| JP | 2009-170825 | 7/2009 |
| JP | 2009-532900 A | 9/2009 |
| JP | 2009-224536 A | 10/2009 |
| JP | 2010-007013 A | 1/2010 |
| JP | 2010-092956 A | 4/2010 |
| JP | 2010-103404 | 5/2010 |
| JP | 2010-206015 A | 9/2010 |
| JP | 2010-226093 A | 10/2010 |
| JP | 2011-127011 | 6/2011 |
| JP | 2011-134508 | 7/2011 |
| KR | 10-0705552 | 4/2007 |
| KR | 10-2007-0084959 | 8/2007 |
| KR | 10-2007-0100124 | 10/2007 |
| KR | 10-2010-0079970 | 7/2010 |
| KR | 10-2010-0086955 | 8/2010 |
| KR | 10-2011-0111243 | 10/2011 |
| TW | 2008/21371 A | 5/2008 |
| TW | 2009/03859 A | 1/2009 |
| TW | 2011/09370 A | 3/2011 |
| WO | WO 2004/077580 A2 | 9/2004 |
| WO | WO 2009-107052 | 9/2009 |
| WO | WO 2010-113852 | 10/2010 |
| WO | WO 2011-109097 | 9/2011 |
| WO | WO 2013-013154 | 1/2013 |
| WO | WO 2013-082445 | 6/2013 |
| WO | WO 2013-085793 | 6/2013 |
| WO | WO 2013-085816 | 6/2013 |
| WO | WO 2013/0101385 | 7/2013 |

OTHER PUBLICATIONS

Non-Final Office Action for U.S. Appl. No. 13/312,508 dated Dec. 17, 2013.
Non-Final Office Action for U.S. Appl. No. 13/372,076 dated Aug. 8, 2013.
Restriction Requirement for U.S. Appl. No. 13/309,177 dated Sep. 16, 2013.
Non-Final Office Action for U.S. Appl. No. 13/309,177 dated Feb. 13, 2014.
Non-Final Office Action for U.S. Appl. No. 13/312,518 dated Feb. 28, 2014.
Non-Final Office Action for U.S. Appl. No. 13/554,769 dated Mar. 18, 2014.
Restriction Requirement for U.S. Appl. No. 13/372,063 dated Apr. 10, 2014.
Restriction Requirement for U.S. Appl. No. 13/691,102 dated Apr. 11, 2014.
"SCS Parylene Coatings for LEDS," Specialty Coating Systems, 2009, pp. 1-2, Indianapolis, IN, USA.
"SCS Electronic Coatings," Specialty Coating Systems, 2010, pp. 1-4, Indianapolis, IN, USA.
International Search Report and Written Opinion for Application No. PCT/US2012/047608 dated Jan. 31, 2013.
International Search Report and Written Opinion for Application No. PCT/US2012/067323 dated Mar. 15, 2013.
International Search Report and Written Opinion for Application No. PCT/US2012/067326 dated Mar. 15, 2013.
International Search Report and Written Opinion for Application No. PCT/US2012/067055 dated Mar. 28, 2013.
International Search Report and Written Opinion for Application No. PCT/US2012/067058 dated Mar. 29, 2013.
Restriction Requirement for U.S. Appl. No. 13/372,076 dated Jan. 31, 2013.
U.S. Appl. No. 13/372,063, filed Feb. 13, 2012.
U.S. Appl. No. 13/444,399, filed Apr. 11, 2012.
U.S. Appl. No. 13/372,076, filed Feb. 13, 2012.
U.S. Appl. No. 13/309,117, filed Dec. 1, 2011.
U.S. Appl. No. 13/554,769, filed Jul. 20, 2012.
U.S. Appl. No. 13/312,508, filed Dec. 6, 2011.
U.S. Appl. No. 13/312,518, filed Dec. 6, 2011.
U.S. Appl. No. 12/757,891, filed Apr. 9, 2010.
Ming Ma, et al., Effects of the refractive index of the encapsulant on the light-extraction efficiency of light-emitting diodes, Optics Express, Sep. 12, 2011, pp. A1135-A1140, vol. 19, No. S5.
Non-Final Office Action for U.S. Appl. No. 13/372,076 dated Mar. 18, 2014.
Non-Final Office Action for U.S. Appl. No. 13/312,518 dated Jul. 17, 2014.
Non-Final Office Action for U.S. Appl. No. 13/372,063 dated Jul. 28, 2014.
Final Office Action for U.S. Appl. No. 13/312,508 dated Aug. 20, 2014.
Non-Final Office Action for U.S. Appl. No. 13/309,177 dated Sep. 11, 2014.
Restriction Requirement for U.S. Appl. No. 13/691,102 dated Oct. 3, 2014.
Final Office Action for U.S. Appl. No. 13/554,769 dated Oct. 16, 2014.
Final Office Action for U.S. Appl. No. 13/312,518 dated Nov. 24, 2014.
Non-Final Office Action for U.S. Appl. No. 13/444,399 dated Nov. 14, 2014.
Japanese Office Action for Application No. 2014/521828 dated Jan. 6, 2015.
Final Office Action for U.S. Appl. No. 13/444,394 dated Jan. 23, 2015.
Taiwanese Office Action for Application No. 101126247 dated Dec. 19, 2014.
Non-Final Office Action for U.S. Appl. No. 13/312,518 dated Mar. 13, 2015.
Narukawa et al. "White light emitting diodes with super-high luminous efficacy", Journal of Physics D, 43 (2010) 354002.
Advisory Action for U.S. Appl. No. 13/554,769 dated Jan. 5, 2015.
"Press Release Nichia Corporation" posted to http://www.nichia.com/en/about_nichia/2010/2010_110201.html on Nov. 2, 2010, captured by Wayback Machine on Dec. 1, 2011, accessed on Nov. 7, 2014.
Korean Office Action for Application No. 10-2014-7004030 dated Feb. 9, 2015.
Non-Final Office Action for U.S. Appl. No. 13/312,508 dated Feb. 18, 2015.
Non-Final Office Action for U.S. Appl. No. 13/309,177 dated Apr. 23, 2015.
Non-Final Office Action for U.S. Appl. Appl. No. 13/554,769 dated Apr. 27, 2015.
Final Office Action for U.S. Appl. No. 13/444,399 dated Apr. 28, 2015.
Non-Final Office Action for U.S. Appl. No. 13/691,102 dated Apr. 24, 2015.
Japanese Office Action for Application No. 2014-545949 dated May 19, 2015.
Korean Office Action for Application No. 10 2014 7018692 dated Jun. 9, 2015.
Korean Office Action for Application No. 10 2014 7018718 dated Jun. 10, 2015.
Supplementary European Search Report for Application No. EP 12855245 dated Jun. 12, 2015.

(56) References Cited

OTHER PUBLICATIONS

Extended European Search Report for Application No. EP 12863904 dated Jun. 22, 2015.
Extended European Search Report for Application No. EP 12853831 dated Jun. 22, 2015.
Final Office Action for U.S. Appl. No. 13/312,508 dated Jul. 22, 2015.
Final Office Action for U.S. Appl. No. 13/312,518 dated Aug. 4, 2015.
Non-Final Office Action for U.S. Appl. No. 13/444,394 dated Aug. 27, 2015.

* cited by examiner

LIGHT EMITTER DEVICES HAVING IMPROVED CHEMICAL AND PHYSICAL RESISTANCE AND RELATED METHODS

CROSS REFERENCE TO RELATED APPLICATION

This application is a continuation-in-part of and claims priority to both U.S. patent application Ser. No. 13/372,063, filed Feb. 13, 2012 now U.S. Pat. No. 8,957,580, and U.S. patent application Ser. No. 13/372,076, filed Feb. 13, 2012 now U.S. Pat. No. 8,946,747, the disclosures of which are incorporated by reference herein in their entireties.

TECHNICAL FIELD

The subject matter herein relates generally to light emitter devices and related methods. More particularly, the subject matter herein relates to light emitter devices having improved chemical and physical resistance and related methods.

BACKGROUND

Light emitting diodes (LEDs) can be utilized in light emitter devices or packages for providing white light (e.g., perceived as being white or near-white), and they are developing as replacements for incandescent, fluorescent, and metal halide high-intensity discharge (HID) light products. Conventional emitter devices or packages can incorporate components such as metallic traces or mounting surfaces which can become tarnished, corroded, or otherwise degraded when exposed to various undesirable chemicals and/or chemical vapors. Such chemicals and/or chemical vapors can enter conventional emitter devices, for example, by permeating an encapsulant filling material disposed over such components. In one aspect, undesirable chemicals and/or chemical vapors can contain sulfur, sulfur-containing compounds (e.g., sulfides, sulfites, sulfates, $SO_x$), chlorine and bromine containing complexes, nitric oxide or nitrogen dioxides (e.g., $NO_x$), and oxidizing organic vapor compounds which can permeate the encapsulant and physically degrade various components within the emitter device by corroding, oxidizing, darkening, and/or tarnishing such components. Such degradation can adversely affect brightness, reliability, and/or thermal properties of conventional emitter devices over time and can further adversely affect the performance of the devices during operation.

Despite the availability of various light emitter devices in the marketplace, a need remains for devices and components having improved chemical and physical resistance and related methods for preventing undesirable chemicals and/or chemical vapors from reaching and subsequently degrading components within the devices. A need also exists for devices with improved brightness. Notably, devices and methods disclosed herein can prevent degradation of optical properties of devices or packages incorporating silver (Ag), Ag alloy, Ag-plated, or Ag-containing substrates or components by preventing tarnishing of the Ag-containing substrates or components.

SUMMARY

In accordance with this disclosure, novel light emitter devices and methods with improved chemical resistance to undesirable chemical components are provided. Novel emitter devices and methods having improved physical resistance to physical damage are also provided. It is, therefore, an object of the present disclosure herein to provide devices and substrates which utilize novel encapsulation techniques and materials for providing devices with improved chemical and physical resistance, as well as improved light output or brightness attributes.

This and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
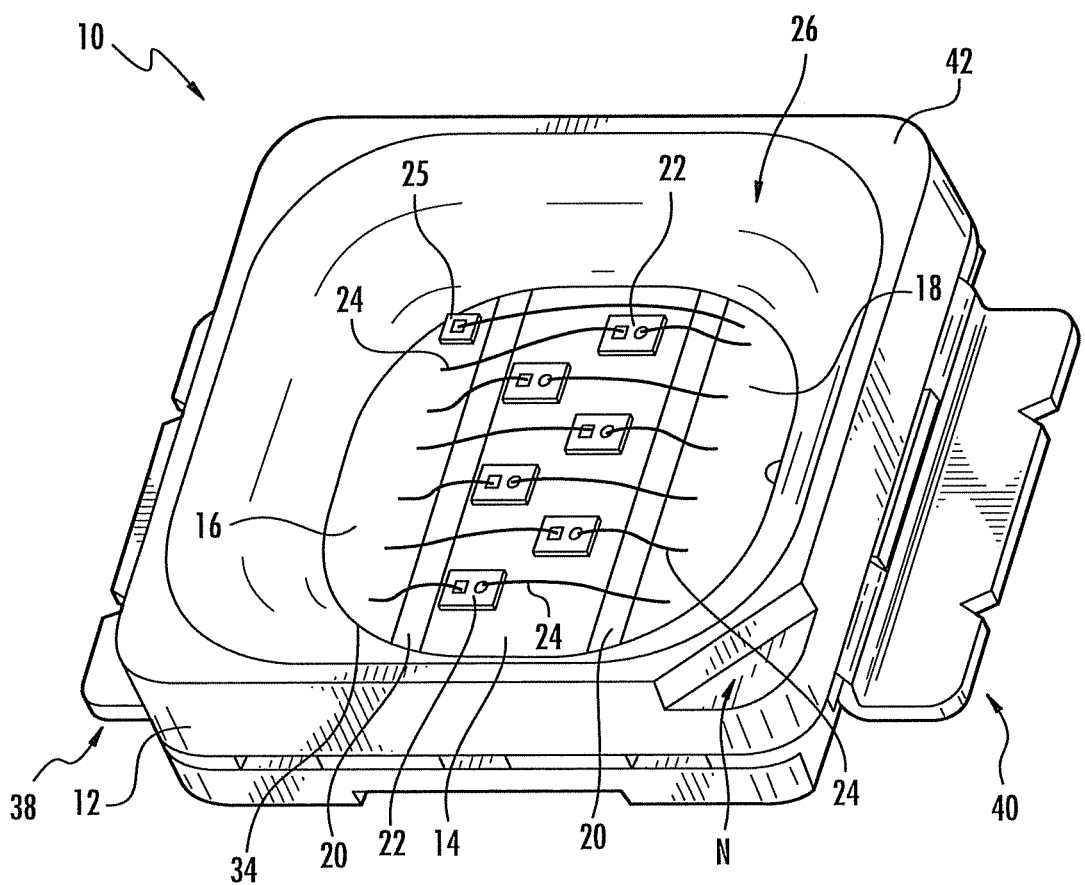
FIG. 1 is a top perspective view of a first embodiment of a light emitter device according to the disclosure herein.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Unless the absence of one or more elements is specifically recited, the terms "comprising," including," and "having" as used herein should be interpreted as open-ended terms that do not preclude the presence of one or more elements.

Light emitter devices according to embodiments described herein can comprise group III-V nitride (e.g., gallium nitride (GaN)) based light emitting chips such as light emitting diode (LED) chips or lasers that can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si) and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of light emitting chips (e.g., LEDs or LED chips) disclosed herein comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based chips or LEDs according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wire bonded. A vertical device (with or without the growth substrate) can have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

One or more LED chips can be at least partially coated with one or more phosphors. The phosphors can absorb a portion of light emitted from the LED chip and emit a different wavelength of light such that the light emitter device or package emits a combination of light from each of the LED chip and the phosphor. In one embodiment, the light emitter device or package emits what is perceived as white light resulting from a combination of light emission from the LED chip and the phosphor. One or more LED chips can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. patent application Ser. No. 12/014,404 entitled "Phosphor Coating Systems and Methods for light emitter Structures and Packaged light emitter Diodes Including Phosphor Coating" and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter devices, systems, and methods according to the present subject matter can also have multiple LED chips of different colors.

Figure 2:
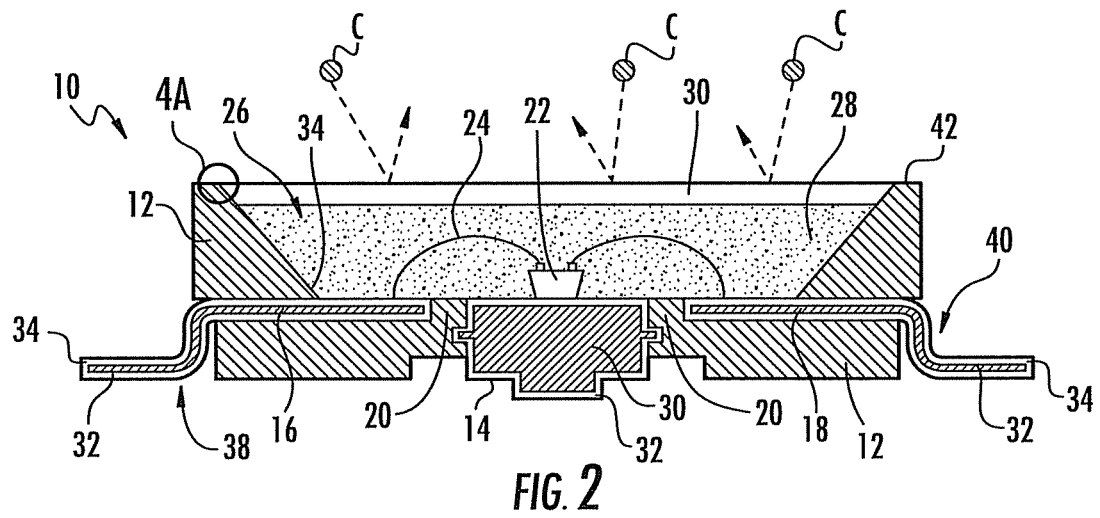
FIGS. 2 and 3 are cross-sectional views of a first embodiment of the light emitter device according to the disclosure herein.
Figure 4A:
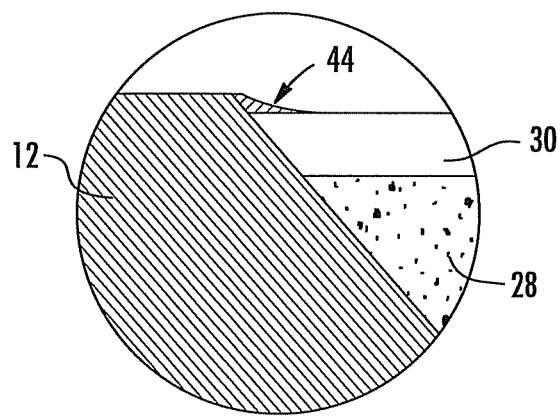
FIGS. 4A to 4C are views of embodiments of details circled in FIGS. 2 and 3 according to the disclosure herein.
Figure 4B:
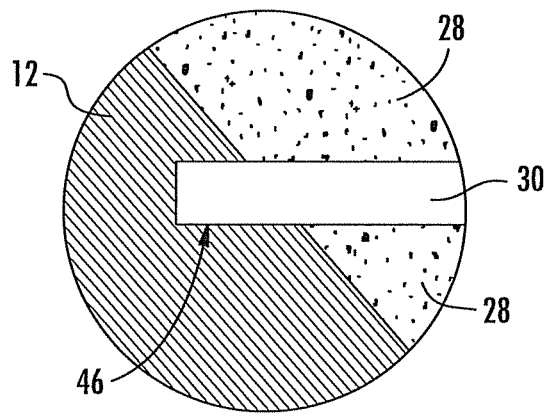
Figure 4C:
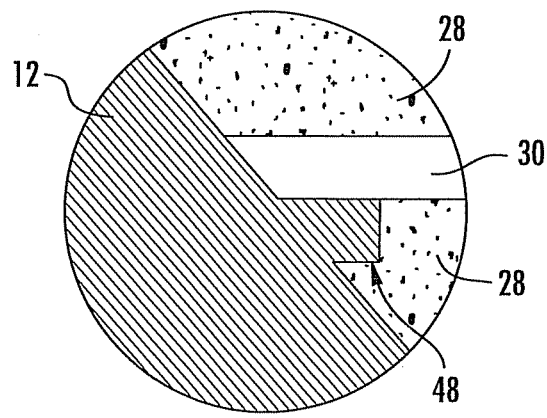
Figure 5:
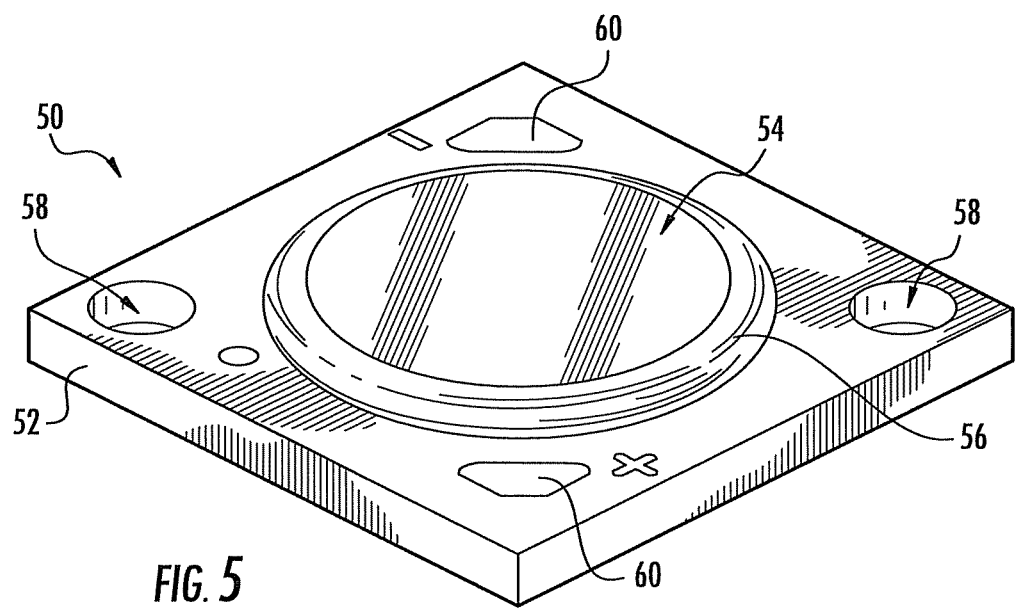
FIG. 5 is a top perspective view of a second embodiment of a light emitter device according to the disclosure herein.
Figure 6:
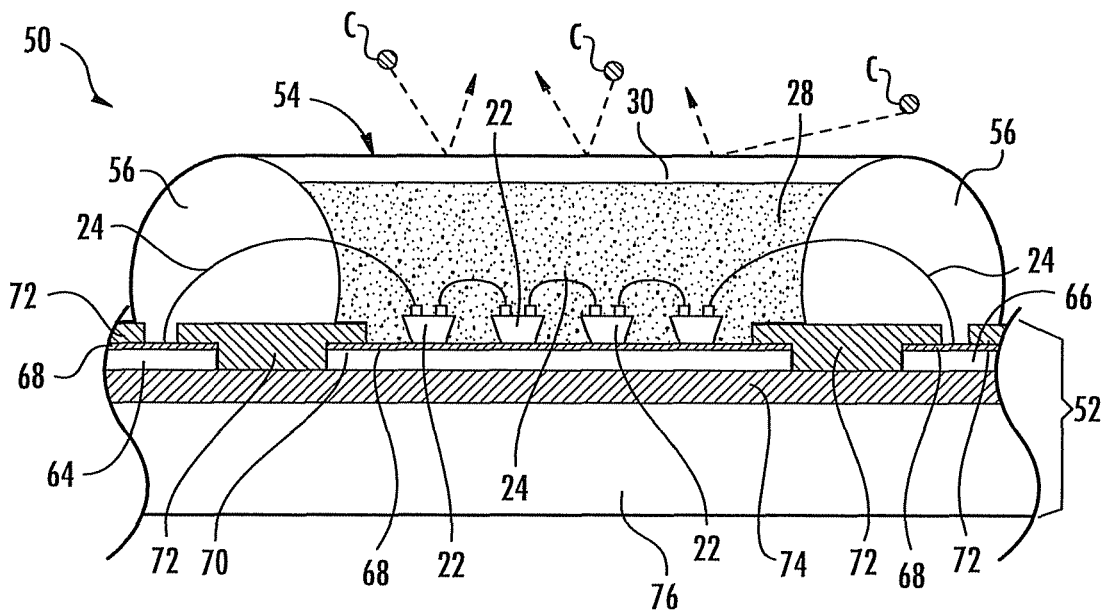
FIGS. 6 and 7 are cross-sectional views of the second embodiment of a light emitter device according to the disclosure herein.
Figure 7:
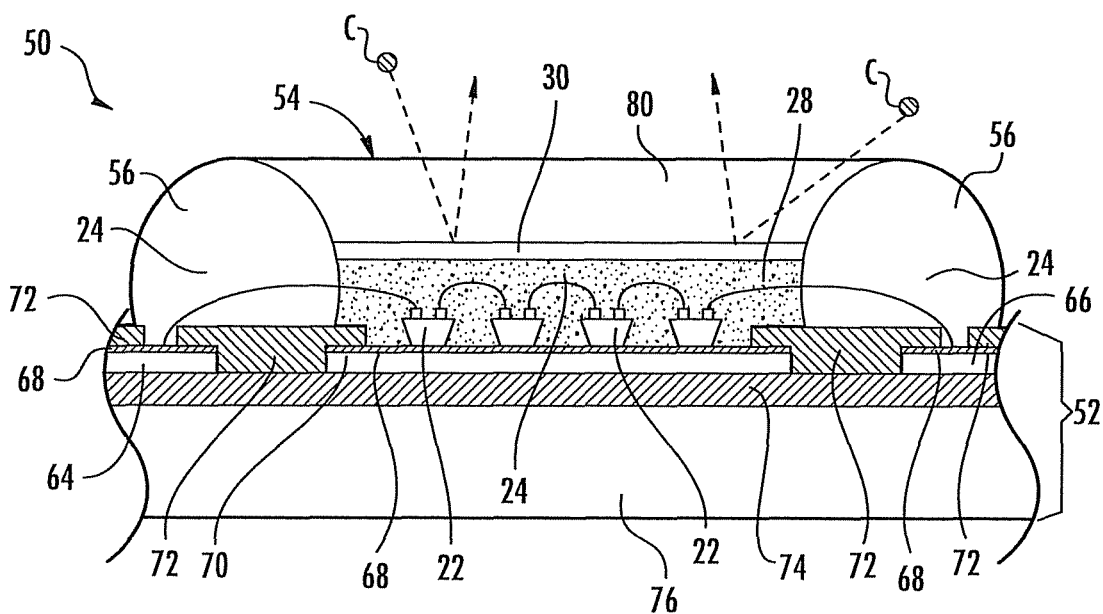

Referring now to FIGS. 1 to 9, FIGS. 1 to 4 illustrate views of one example of a light emitter package or device generally designated 10. FIGS. 5 to 7 illustrate views of another light emitter package or device, generally designated 50. In one aspect, light emitter devices 10 and 50 can comprise a surface mount device (SMD) type of emitter package comprising a respective body 12 or submount 52 which can be molded, formed about, or otherwise incorporate components such as electrical leads. SMD type light emitter devices can be suitable for general LED illumination applications, such as indoor and outdoor lighting, automotive lighting, and preferably suitable for high power and/or high brightness lighting applications. The subject matter disclosed herein can be suitably adapted for application within a wide range of SMD type light emitter device designs, not limited to dimensional and/or material variations. Notably, devices and methods disclosed herein can exhibit improved chemical and physical resistance to undesirable chemical species and/or physical damage in part by provision of at least one clear barrier layer of material disposed within a cavity of the SMD type device. The clear barrier can be adapted to prevent attacks to various device components by harmful chemicals, chemical species, or chemical and/or vaporous complexes, for example, by preventing such components (e.g., Ag or Ag-containing components or substrates) from tarnishing and/or otherwise degrading within the devices. Further, devices and methods disclosed herein can advantageously exhibit improved initial light output and be adapted to maintain such initial light output (e.g., by approximately 95% or more, see FIGS. 8 and 9) even in the presence of harmful chemicals, chemical vapors, or complexes by provision of the clear barrier layer 30 (FIGS. 2, 6, 7).

Referring to FIGS. 1 to 4 and in one aspect, emitter device 10 can comprise a body 12. Body 12 can be disposed about electrical leads or lead components comprising a thermal element 14 and one or more electrical elements, for example, first and second electrical elements 16 and 18, respectively. That is, thermal element 14 and electrical elements 16 and 18 can be collectively referred to as a "leads" which can be singulated from a sheet of leadframes (not shown). A corner notch, generally designated N can be used for indicating electrical polarity of first and second electrical elements 16 and 18. Thermal element 14 and first and second electrical elements 16 and 18 can comprise a material that is electrically and/or thermally conductive such as a metal or metal alloy. In one aspect, thermal element 14 can be electrically and/or thermally isolated from one and/or both of first and second electrical elements 16 and 18 by one or more isolating portions 20 of the body. Thermal element 14 can also be physically separated from electrical elements 16 and 18 via isolating portions 20 of the body. One or more LED chips 22 can be mounted over thermal element 14 using any suitable die attach technique(s) and/or material(s), for example only and not limited to die attach adhesive (e.g., silicone, epoxy, or conductive silver (Ag) epoxy) or a metal-to-metal die attach technique such as flux or no-flux eutectic, non-eutectic, or thermal compression die attach.

LED chips 22 can electrically communicate with one and/or both first and second electrical elements 16 and 18 via one or more electrical connectors such as electrically conductive wire bonds 24. For illustration purposes, LED chips 22 can comprise a horizontal device having two electrical contacts (e.g., anode and cathode) on the same side (e.g., upper surface) that can be electrically connected to two electrical elements (e.g., 16 and 18) via wire bonds 24. However, LED chips 22 having one electrical contact on the upper surface that is electrically connected with a single electrical element 16 or 18 is also contemplated. In further embodiments, LED chips 22 could comprise a horizontal device having both electrical contacts on the bottom surface, where one contact could be directly attached to first electrical element 16 and the second contact could be directly attached to second electrical element 18.

Any type, style, structure, build, size, and/or shape of LED chip 22 can be used in devices described herein, for example, LED chip 22 can comprise a horizontally structured chip (e.g., having at least two electrical contacts on a same side of the LED) or a vertically structured chip (e.g., with electrical contacts on opposing sides of the LED) with or without a growth substrate. LED chip 22 can comprise one or more substantially straight cut and/or beveled (i.e., angled) cut sides or surfaces. LED chip 22 can comprise a direct attach build (e.g., bonded to a carrier substrate) or a build incorporating a grown substrate such as sapphire, SiC, or GaN. LED chips 22 can be substantially square or rectangular in shape. LED chips 22 having any build, structure, type, style, shape, and/or dimension are contemplated herein.

Wire bonds 24 or other electrical attachment connectors and related methods can be adapted to communicate, transmit, or convey an electrical current or signal from electrical elements 16 and 18 to one or more LED chips 22 thereby causing illumination of the one or more LED chips 22. Thermal element 14 and/or first and second electrical elements 16 and 18, respectively, can be coated, plated, deposited, or otherwise layered with a reflective material (e.g., 34 of FIGS. 2, 3), such as, for example and without limitation Ag-containing materials such as pure Ag, Ag plate, and/or Ag alloy materials for reflecting light from the one or more LED chips 22. The present subject matter can improve the chemical resistance of device 10 by incorporating a clear barrier layer 30 (FIG. 2, 3, 6, 7) serving as a protective barrier or barrier layer disposed over one or more Ag-containing substrates of device 10, within device 10, and/or over components of device 10 to prevent contaminants or other material, such as complexes C for illustration purposes (FIGS. 2, 3, 6, 7), from reaching, interacting with, and/or adversely affecting components such as Ag-containing outer portion 34 (FIGS. 2, 3) of thermal and electrical elements 14, 16, and 18.

In general, LED chips 22 as described herein can embody a solid state emitter used alone and/or in combination with one or more phosphors or lumiphors to emit light of various colors, color points, or wavelength ranges. In one aspect LED chips 22 can comprise chips selected from the following targeted wavelength bins: (1) primarily blue wavelengths (preferably approximately 430 nm to 480 nm; optionally 430-475 nm, 440-475 nm, 450-475 nm, or any suitable sub-range of 430-480 nm); (2) primarily cyan wavelengths (preferably approximately 481 nm to 499 nm); (3) primarily green wavelengths (preferably approximately 500 nm to 570 nm, optionally 505-515 nm, 515-527 nm, or 527-535 nm, or 535-570 nm, or any suitable sub-range of 500-570 nm a or any suitable sub-range of 500-570 nm); (4) primarily yellow wavelengths (preferably approximately 571 to 590 nm); and (5) primarily red wavelengths (preferably approximately 591 to 750 nm, including an optional orange sub-range (preferably approximately 591 to 620 nm), or 621-750 nm, or 621-700 nm, or 600-700 nm, or 610-700 nm, or 610-680 nm, or 620-680 nm, or 620-670 nm, and/or any suitable sub-range of 591 to 750 nm).

Still referring to FIGS. 1 to 4, body 12 can comprise any suitable material molded or otherwise disposed about thermal element 14 and/or first and second elements 16 and 18, respectively. In one aspect, body 12 can comprise a ceramic material such as a low temperature co-fired ceramic (LTCC) material, a high temperature co-fired ceramic (HTCC) material, alumina, aluminum nitride (AlN), aluminum oxide ($Al_2O_3$), glass, and/or an Al panel material. In other aspects, body 12 can comprise a molded plastic material such as polyamide (PA), polyphthalamide (PPA), liquid crystal polymer (LCP), or silicone. One or more electrostatic discharge (ESD) protection devices 25 can optionally be disposed within device 10 and can be electrically connected to electrical elements 16 and 18 and reverse biased with respect to LED chips 22. Where used, ESD device 25 can protect against damage from ESD within device 10. For example, the arrangement of LED chips 22 and ESD protection device 25 allows excessive voltage and/or current passing through light emitter device 10 from an ESD event to pass through protection device 25 instead of LED chips 22 thereby protecting LED chips 22 from damage. In one aspect, different elements can be used as ESD protection devices 25 such as various vertical silicon (Si) Zener diodes, different LEDs arranged reverse biased to LED chips 22, surface mount varistors and lateral Si diodes. As illustrated, ESD device 25 can comprise a vertically structured device having one electrical contact on the bottom and another electrical contact on the top; however, horizontally structured devices are also contemplated.

Figure 3:
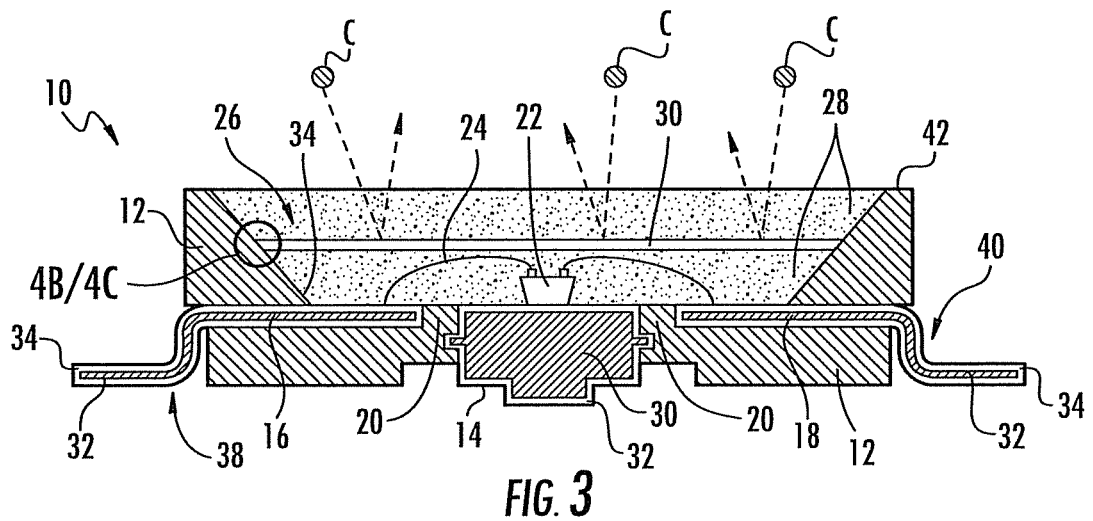

Body 12 of device 10 can comprise a light emission area comprising a space or cavity, generally designated 26, for example, a reflector cavity optionally coated with a reflective material for reflecting light from the one or more LED chips 22. As FIGS. 2 and 3 illustrate, one or more LED chips 22 can be disposed in cavity 26 under a filling material. The filling material can be at least partially disposed within the cavity 26 or space and over the one or more LED chips 22. Filling material can comprise a first discrete layer of filling material, such as an encapsulant layer 28 which can optionally comprise one or more phosphors, lumiphors, and/or phosphoric or lumiphoric materials as denoted by the shaded or speckled appearance. Encapsulant layer 28 can comprise a layer of silicone encapsulant as known in the art. As silicone can be susceptible to penetration by chemical complexes C (FIGS. 2, 3), a second discrete layer of material such as clear barrier layer 30 can be arranged over at least a portion of encapsulant layer 28 for improving chemical resistance of device 10. In one aspect, the one or more phosphors disposed in encapsulant layer 28 can be adapted to emit light of a desired wavelength when activated by light emitted from the one or more LED chips 22. Thus, in one aspect, device 10 can emit light having a desired wavelength, color temperature or color point that can be a combination of light emitted from phosphors disposed in encapsulant layer 28 and from the light emitted from one or more LED chips 22. In one aspect, encapsulant layer 28 can be adapted for dispensing within cavity 26.

At least some of the LED chips 22 can be coated with or otherwise disposed to impinge light onto one or more phosphors disposed within encapsulant layer 28. Encapsulant layer 28 can be adapted to absorb at least some of the LED chip emissions and responsively emit light of a different wavelength. LED chip emissions can be fully absorbed or only partially absorbed such that emissions from the resulting device include a combination of light from the LED chip 22 and light from one or more phosphors. In certain embodiments, at least one of the LED chips 22 can comprise an LED that emits light in the blue wavelength spectrum, with a phosphor absorbing some of the blue light and re-emitting yellow light. The resulting LED chip 22 and phosphor combination may emit a combination of blue and yellow light appearing white or non-white. Any commercially available yellow phosphor can be used for white emitting LED chips 22 in devices described herein. In other embodiments, at least one of the LED chips 22 can comprise an LED that emits light in the blue wavelength spectrum and arranged to interact with other phosphors that absorb blue light and emit green light. Any commercially available green phosphor can be used in devices described herein.

LED chips 22 emitting red light can also be provided and used alone and/or in combination with other LED chips 22 for producing warm white light and can comprise LED structures and materials that permit emission of red light directly from the active region of the LED chip 22 (e.g., a phosphide-based active region). Alternatively, red emitting LED chips 22 can comprise LEDs covered by a phosphor that absorbs the LED light and emits a red light which can combine with other emissions for achieving warm white light. Any combination of LED chip(s) 22 and phosphor(s) wavelength emissions can be used to achieve the desired aggregated spectral output. It is understood that light emitter packages 10 and 50 (FIGS. 5 to 7) as described herein can include multiple LED chips 22 of the same and/or different colors, of which one or more may emit white light or near-white light.

Referring to FIGS. 2 and 3, thermal element 14 and first and second electrical elements 16 and 18 can comprise an inner portion 32 and an outer portion 34. In one aspect, inner portion 32 and outer portion 34 can comprise electrically and/or thermally conductive materials. Outer portion 34 may be applied such that it entirely surrounds inner portion 32 as shown, or in other aspects outer portion 34 can optionally plate, coat, or comprise a layer over a single surface or two or more surfaces of portion 32. In one aspect, outer portion 34 can comprise a highly reflective Ag-containing substrate or layer of material such as Ag for maximizing light output from device 10 and for assisting in heat dissipation by conducting heat away from the one or more LED chips 22. Outer portion 34 can also comprise a substrate containing a Ag alloy instead of pure Ag, and such alloy can contain other metals such as titanium (Ti) or nickel (Ni). Inner portion 32 can comprise a metal or metal alloy such as copper (Cu) substrate or Cu-alloy substrate. In one aspect, an optional layer of material (not shown) can be disposed between inner portion 32 and outer portion 34, such as a layer of Ni for providing a barrier between the Ag and Cu, thereby preventing defects caused by migratory Cu atoms, such as a defect commonly known as "red plague". In other aspects, outer portion 34 can be directly attached to and/or directly coat inner portion 32. Outer portion 34 can advantageously reflect light emitted from the one or more LED chips 22 thereby improving optical performance of device 10.

Upper surfaces of thermal element 14 and electrical elements 16 and 18 can be disposed along a floor 36 of cavity 26 such that respective upper surfaces of thermal and electrical elements can be disposed along the same plane and/or different planes. For example, as shown, upper surfaces of thermal element 14 and electrical elements 16 and 18 are disposed along the same plane which is also the plane of floor 36. In other aspects, thermal element 14 can be downset such that an upper surface of thermal element 14 can be disposed below floor 36 such that it is below the plane of respective upper surfaces of each electrical element 16 and 18. That is, thermal element 14 can be downset such that it is disposed on a lower plane than electrical elements 16 and 18 such that thermal element 14 appears sunken in respect to electrical elements 16 and 18. First and second electrical elements 16 and 18 can extend internally through body 12 and externally from one or more lateral sides of body 12 and form one or more external tab portions, generally designated 38 and 40. Tab portions 38 and 40 can bend to form one or more lower mounting surfaces such that device 10 can be mounted to an underlying substrate. Tab portions 38 and 40 can outwardly bend away from each other or inwardly bend towards each other thereby adapting either a J-bend or gull-wing orientation as known in the art. However, any configuration of external tabs 38 and 40 is contemplated.

As noted earlier, filling material of device 10 can comprise a first layer (e.g., encapsulant layer 28) and a second discrete and physically separate second layer (e.g., clear barrier layer 30). Such layers can comprise different materials. Notably, second discrete layer of material can be at least partially disposed above and/or below the encapsulant layer 28. Clear barrier layer 30 can be adapted to provide a physical and chemical barrier against harmful chemical complexes generally designated C. As FIGS. 2 and 3 illustrate, harmful chemical complexes C cannot physically penetrate clear barrier layer 30 as indicated by the dotted trajectory lines extending from complexes C, and therefore, cannot degrade components within device 10 disposed below barrier layer 30. In one aspect, clear barrier layer 30 can comprise a substantially flat piece of glass that has been cut, trimmed, etched, machined, and/or otherwise physically and dimensionally sized to directly or indirectly cover at least a portion of encapsulant layer 28. In one aspect, barrier layer 30 can comprise any type of glass or glass material including but not limited to silica based or silica containing glasses, fluoride containing glasses, aluminosilicates, phosphate containing glasses, borate containing glasses, chalcogenide glasses, glass-ceramic materials, acrylic glasses, polycarbonate materials, polyethylene terephthalate materials, polymer glasses, soda lime glasses, borosilicate glasses, and/or combinations thereof. Clear barrier layer 30 can, for example and without limitation, comprise a substantially flat, non-domed portion of material that is not primarily useful in curving about chips to focus light. That is, barrier layer 30 can be one that has no or little focusing effect on light passing therethrough such that it is not useful for focusing light as are conventional domed lenses. Instead, barrier layer 30 can provide a physical and chemical barrier thereby protecting device 10 and can actually increase light output by increasing light extraction efficiency.

In general and as used herein, "glass" or "glass material" can comprise any non-crystalline (i.e., amorphous) structure that exhibits a glass transition (i.e., at a glass transition temperature) when heated towards a liquid state. The glass transition (i.e., also known as a liquid-glass transition) can describe a reversible transition in amorphous materials (or in amorphous regions within semi-crystalline materials) from a hard and relatively brittle state to a molten or rubber-like state. Any amorphous solid that exhibits a glass transition, can, in general, be used to describe a "glass" or "glass material" as used herein. Notably, clear barrier layer 30 can also be adapted to improve light output by increasing light extraction efficiency. In one aspect, addition of clear barrier layer 30 within device 10 can improve the light output of device 10 (e.g., improve the luminous flux) by approximately 1% or more (e.g., see FIG. 8). In other aspects, addition of clear barrier layer 30 within device 10 can improve the luminous flux by approximately 2% or more, and even by approximately 5% or more. Clear barrier layer 30 can have any suitable thickness. For example and without limitation, the thickness of clear barrier layer 30 can be approximately 0.1 mm or greater. In one aspect, the thickness of clear barrier layer 30 can be approximately 0.6 mm or greater. In another aspect, the thickness of clear barrier layer 30 can be approximately 0.6 mm or less. In a further aspect, the thickness of clear barrier layer 30 can be from approximately 0.8 mm to 5 mm.

Volumetrically, clear barrier layer 30 can, for example and without limitation, comprise anywhere from approximately 1 to 70% or more of a total encapsulant volume or a total cavity 26 volume, depending upon the package and thickness used. In one aspect, clear barrier layer 30 can comprise a range of between approximately 5 and 50% of a total cavity 26 volume. For example, device 10 can comprise an overall thickness of approximately 2 mm, with clear barrier layer 30 comprising a thickness of approximately 0.6, thus, approximately a 30% by volume ratio. In one aspect, device 10 can comprise a clear barrier layer 30 having a thickness of approximately 0.1 mm or greater. Device 10 can comprise an overall thickness of approximately 2.0 mm or less or approximately 2.0 mm or greater. In one aspect, device 10 can comprise an overall thickness of approximately 1.5 mm or greater. Device 10 can comprise a ratio of thickness of clear barrier layer 30 to thickness of the light emitter device 10 that is approximately 25% or greater. The ratio of thickness of clear barrier layer 30 to thickness of the light emitter device 10 can also be approximately 30%. In further embodiments, device 10 can comprise a ratio of thickness of clear barrier layer 30 to thickness of light emitter device 10 that is approximately 25% or less.

As FIGS. 2 and 3 further illustrate, and in one aspect, clear barrier layer 30 can be directly disposed over one or more portions of encapsulant layer 28. As FIG. 3 illustrates, clear barrier layer 30 can be disposed between one or more encapsulant layers 28. Clear barrier layer 30 can for example be applied during or after application of encapsulant layer 28 to provide a physical and chemical barrier between the outside environment and Ag-containing substrates or components such as outer portion 34 of thermal/electrical components or elements. FIGS. 6 and 7 illustrate various other alternative locations and/or arrangements of clear barrier layer 30 in a SMD type package or device for providing protection against chemical complexes C and against physical damage to components within the device. In one aspect, undesired chemicals, vapors, or complexes C can comprise chemical vapors containing sulfur, sulfur containing compounds (sulfides, sulfites, sulfates, $SO_x$), chlorine or bromine containing complexes, nitric oxide or nitrogen dioxide ($NO_x$), and/or oxidizing organic vapor compounds. Complexes C can degrade the Ag components (e.g., outer portion 34 of thermal/electrical elements) and result in a loss of brightness output and noticeable darkening of surfaces within the device. Clear barrier layer 30 can improve the chemical resistance of device 10 and components within device 10 such that harmful vapors, chemicals, or complexes C cannot reach Ag-containing components (e.g., outer portion 34) as illustrated by the dotted trajectory of complexes C being repelled from the surface of clear barrier layer 30, thereby minimizing the damage to reflective Ag components, and further minimizing and/or totally preventing any loss in brightness from device 10 and/or darkening of components within device 10.

Notably, clear barrier layer 30 can be selectively applied at or in parallel with any number of processing steps within the manufacturing process (e.g., before/during/after encapsulation) for providing broad protection against chemical vapors, such as but not limited to, nitric oxide or nitrogen dioxide ($NO_x$), oxidizing organic vapor compounds, sulfur, sulfur-containing compounds (e.g., sulfides, sulfates, $SO_x$) and chlorine- or bromine-containing complexes. Notably, when a clear barrier layer 30 is incorporated, devices described herein can exhibit excellent chemical, including sulfur, resistance and long lasting protection against chemical complexes C as compared to conventional devices. In one aspect, device 10 can retain approximately 95% or more of its initial brightness value (e.g., measured in lumens, see FIG. 9) when exposed to a sulfur environment as compared to conventional devices which may only retain approximately 70% of its initial brightness value when exposed to the same sulfur environment. Depending on the level of sulfur present and severity of the environment, an improved device such as device 10 can retain approximately 100% of its initial brightness value.

As FIG. 2 illustrates, in one aspect, clear barrier layer 30 can be disposed above a single encapsulant layer 28 as shown. Clear barrier layer 30 can be, but does not have to be substantially the same length and width dimension and/or the same geometry as underlying encapsulant layer 28. In one aspect, an embodiment where clear barrier layer 30 is the same or substantially the same as encapsulant layer 28 may be preferred as encapsulant layer 28 can be fully covered by layer 30 and can be better protected against permeation by harmful chemical complexes C. As the detailed view in FIG. 4A illustrates and as discussed further below, in some aspects a thin layer of silicone encapsulant and/or other material can be applied along edges of clear barrier layer 30 thereby forming a fillet or fillet member (e.g., 44, see FIG. 4A) to improve adhesion of layer 30 within device 10. The fillet 44 (FIG. 4A) can be disposed between portions of clear barrier layer 30 and body 12 of device and can act as glue for holding clear barrier layer 30 in place. Such layer or fillet is optional. As FIG. 3 illustrates, clear barrier layer 30 can also be disposed between more than one encapsulant layer 28. For example, clear barrier layer 30 can be disposed between a first encapsulant layer 28 and a second encapsulant layer 28 for preventing chemical complexes from reaching vulnerable components (e.g., Ag-containing portion 34 of electrical elements 16 and 18) within device 10. Clear barrier layer 30 can also be disposed between one or more encapsulant layers 28, where at least one of the layers does not contain phosphors or lumiphors (e.g., an optically clear encapsulant layer 80, see FIG. 7). Clear barrier layer 30 can comprise any suitable material that is optically clear and adapted to provide a solid, non-crystalline structure capable of providing a chemical and physical barrier when placed over encapsulant layer 28. As noted previously, clear barrier layer 30 can comprise a glass or glass material such as silica based or silica containing glasses, fluoride glasses, aluminosilicates, phosphate glasses, borate glasses, chalcogenide glasses, glass-ceramic materials, acrylic glasses, polycarbonate materials, polyethylene terephthalate materials, polymer glasses, soda lime glasses, borosilicate glasses, and/or combinations thereof which can be placed within one or more walls of the light emission area or cavity 26.

In one aspect, clear barrier layer 30 can comprise a layer of material that is not molded or dispensed and that can be physically shaped via cutting, trimming, machining, etching, etc. and adapted to fit over and completely or substantially cover encapsulant layer 28. Clear barrier layer 30 can comprise a layer of material that does not contain phosphoric or lumiphoric materials therein, but can optionally be coated with phosphoric material and/or any other desired coating, such as diffusers, reflectors and/or anti-reflection layers that may optionally affect light emission and/or reflection. In one aspect, clear barrier layer 30 can comprise a material adapted to protect device 10 against attack from chemical complexes C, but it can also advantageously provide general physical protection of device as well. For example, clear barrier layer 30 can provide general physical protection of LED chips 22 and wirebonds 24 from physical damage that may potentially result from physical penetration of encapsulant layer 28. As such, clear barrier layer 30 can advantageously improve chemical and physical resistance of device 10.

Still referring to FIGS. 2 and 3, clear barrier layer 30 (and/or encapsulant layer 28 depending upon which layer is on top) can be partially disposed below and/or above an upper surface 42 of device 10. In one aspect, filling material can comprise clear barrier layer 30 disposed above encapsulant layer 28 where clear layer is flush or substantially flush with upper surface 42 of device as shown. That is, clear barrier layer 30 can be substantially flush with and disposed along the same plane as upper surface 42 of device 10. In alternative aspects, filling material can comprise encapsulant layer 28 disposed above clear barrier layer 30 where encapsulant layer 28 of filling material can be filled to a level flush with upper surface 42 of device. Clear barrier layer 30 can be at least partially disposed below upper surface 42. In further aspects, clear barrier layer 30 can be entirely disposed below upper surface 42 of device. In further aspects, the encapsulant layer 28 can be filled such that it forms a concave or convex surface with respect to upper surface 42 of device 10. As clear barrier layer 30 comprises a physical glass or plastic barrier, it can comprise substantially flat (i.e., non-domed) surfaces whether disposed above and/or below upper surface 42. In one aspect, clear barrier layer 30 is preferably disposed above LED chips 22 and respective wire bonds 24.

Referring to FIG. 3, where more than one encapsulant layer 28 is used and during manufacture of device 10, a first layer of material (e.g., encapsulant 28 with or without phosphors) can be deposited in cavity 26 first and then immediately cured prior to application or placement of clear barrier layer 30 and prior to dispensing the second layer of material (e.g., a subsequent encapsulant layer 28) such that the second or subsequently deposited encapsulant layer can undergo a separate curing step at a different time and/or temperature. In other aspects, second encapsulant layer 28 can be sequentially dispensed within cavity 26 over first encapsulant layer 28 and after placement of clear barrier layer 30 such that the separately dispensed encapsulant layers can be cured at the same time. That is, multiple dispense and multiple curing steps (i.e., separately dispensing and curing of encapsulant layers 28) are contemplated herein, or multiple dispense and one curing step (i.e., separately dispensing and simultaneous curing of encapsulant layers 28) are contemplated herein. Notably and regardless of the arrangement, clear barrier layer 30 can be directly disposed adjacent at least one encapsulant layer 28 and/or over a portion of at least one encapsulant layer. Notably, the various devices shown and described herein can comprise the additional, discrete clear barrier layer 30 that can be physically separate and a different material than one or more encapsulant layer(s) 28 for improving chemical and physical resistance as well as light output or brightness of device 10.

FIG. 4A is a close up view of the detail circled in FIG. 2. FIGS. 4B and 4C are close up views of the detail circled in FIG. 3. FIG. 4A illustrates a clear and/or reflective fillet generally designated 44 which can be placed or dispensed over clear barrier later 30 for improving adhesion of layer 30 within device 10. Fillet 44 can comprise a layer of clear silicone encapsulant or other dispensable material and can be adapted to secure and/or "glue" clear barrier layer 30 within device 10. FIGS. 4B and 4C illustrate further embodiments operable to retain clear barrier layer 30 in device 10. In some aspects, clear barrier layer 30 can simply be cut, trimmed, machined, and/or otherwise sized and configured such that it is substantially the same size as inner walls of cavity 26 such that clear barrier layer 30 can simply be positioned over and float over encapsulant 28 as illustrated in FIGS. 2 and 3. That is, the retaining members in FIGS. 4A to 4C may not be required, and are therefore optional.

In other embodiments and as illustrated by FIG. 4B, device 10 can comprise a notch, generally designated 46, adapted to receive a portion of clear barrier layer 30. That is, one or more notches 46 can be formed in sidewalls of cavity 26 such that clear barrier layer 30 can extend or be inset between one or more portions of body 12. In one aspect, clear barrier layer 30 can be at least partially disposed within body 12 when inset in notch 46. As FIG. 4C illustrates, in one aspect a portion of body 12 can be adapted to protrude from a sidewall of cavity 26 such that clear barrier layer 30 can rest over the protruding or projecting portion, generally designated 48. In one aspect, projecting portion 48 can comprise a small, miniscule dimension such that it does not interfere with and/or block light emitted from LED chips 22. More than one projecting portions 48 can be disposed or spaced about wall(s) of cavity 26 at substantially the same height such that clear barrier layer 30 can be positioned substantially flat within device 10. As illustrated in FIGS. 2 and 3, outermost exterior or lateral walls of clear barrier layer 30 can optionally comprise beveled or angled sides for fitting substantially flush against inner walls of cavity 26.

Of note, one or more additional processing techniques or steps can optionally be performed during manufacture of devices described herein for improving adhesion between one or more layers within the devices. Such optionally processing steps can be used and applied to devices previously shown and described, as well as device 50 shown and described in FIGS. 5 through 7 hereinbelow. For example, such optional techniques can be performed to one or more surfaces of underlying encapsulant layer 28, clear barrier layer 30, and/or clear encapsulant 80 (FIG. 7) prior to deposition or application of one or more subsequent surfaces or layers within a device. In one aspect, one or more of these surfaces (e.g., of layers 28, 30, and/or 80) can be physically, chemically, or thermally prepared or treated to improve adhesion between the treated surface and adjacent surface(s) or adjacent layer(s). Optional processing steps that are physical in nature can comprise, for example and without limitation, sandblasting, plasma etching, brushing, lapping, sanding, burnishing, grinding, and/or any suitable form of surface roughening (e.g., physically texturizing the surface) to improve adhesion between one or more layers or surfaces within devices shown and described herein. Optional processing steps that are chemical in nature can comprise, for example and without limitation, chemical etching, applying solvents, applying organic solvents, applying acids, applying bases, vapor degreasing, priming, or any suitable chemically process for treating a surface to improve adhesion between one or more layers or surfaces within devices shown and described herein. Optional thermal processing steps can comprise, without limitation, prebaking, preheating, or any suitable thermal treatment that improves adhesion between one or more layers or surfaces within devices shown and described herein.

FIGS. 5 to 7 illustrate top perspective and cross-sectional views of another embodiment of a light emitter package or device, generally designated 50. Light emitter device 50 can also incorporate an optically clear barrier layer 30 (FIGS. 6, 7) that is physically separate or discrete from an encapsulant layer 28 which can optionally contain phosphor. As described above, barrier layer 30 can advantageously improve chemical and physical resistance of device 50 by serving as a physical and chemical barrier against harmful chemical complexes C and/or physical damage when chemical or physical components permeate encapsulant layer 28. Clear barrier layer 30 can also improve light output or brightness of device 50.

Light emitter device 50 can comprise an SMD type package, similar to device 10. Light emitter device 50 can comprise a submount 52 over which a light emission area, generally designated 54, can be disposed. Light emission area 54 can comprise a cavity or space in which one or more LED chips 22 can be disposed under at least a first layer of filling material, such as an encapsulant layer 28 (see FIGS. 6, 7). As previously described, LED chips 22 can comprise a plurality of chips adapted to emit the same color or targeted wavelength of light, or at least one of the plurality of LED chips 22 can be adapted to emit light that is a different color (e.g., from a different targeted wavelength bin) than a second LED of the plurality of LED chips 22. In one aspect, a single LED chip 22 is contemplated for use in emitter devices described herein. LED chips 22 can be configured to emit light having wavelengths in the visible spectrum portion of the electromagnetic spectrum in any of the previously described colors and/or wavelength ranges. Also as described above, encapsulant layer 28 can comprise phosphors adapted to emit light in any color, for example, yellow, green, and/or red when activated by emissions from the one or more LED chips 22. Any combination of LED chip 22 and phosphor colors or targeted wavelength ranges are contemplated herein for producing white light, cool white light, and/or warm white light. In one aspect, emission area 54 can be substantially centrally disposed with respect to submount 52 of light emitter device 50. In the alternative, emission area 54 can be disposed at any location over light emitter device 50, for example, in a corner or adjacent an edge. Any location is contemplated, and more than one emission area 54 is also contemplated. For illustration purposes, a single, circular emission area 54 is shown; however, the number, size, shape, and/or location of emission area 54 can change subject to the discretion of light emitter device consumers, manufacturers, and/or designers. Emission area 54 can comprise any suitable shape such as a substantially circular, square, oval, rectangular, diamond, irregular, regular, or asymmetrical shape. Light emitter device 50 can further comprise a retention material 56 at least partially disposed about emission area 54 where retention material 56 can be referred to as a dam. Retention material 56 can comprise any material such as a silicone, ceramic, thermoplastic, and/or thermosetting polymer material. In one aspect, retention material 56 is adapted for dispensing about emission area 54, which can be advantageous as it is easy to apply and easy to obtain any desired size and/or shape.

Submount 52 can comprise any suitable mounting substrate, for example, a printed circuit board (PCB), a metal core printed circuit board (MCPCB), an external circuit, a dielectric laminate panel, a ceramic panel, an Al panel, AlN, $Al_2O_3$, or any other suitable substrate over which lighting devices such as LED chips may mount and/or attach. LED chips 22 disposed in emission area 54 can electrically and/or thermally communicate with electrical elements disposed with submount 52, for example, electrically conductive traces (e.g., 64, 66 of FIGS. 6, 7). Emission area 54 can comprise a single and/or a plurality of LED chips 22 disposed within and/or below encapsulant layer 28 such as illustrated in FIG. 6. A first layer of reflecting material 68 can be disposed between portions of submount 52 and LED chips 22. For example, layer 68 can comprise a layer of reflective Ag-containing material such as pure Ag or a Ag-alloy material for maximizing brightness of light emitted from light emitter device 50. Notably, emission area 54 of light emitter device 50 can comprise more than one layer of filling material, where at least one layer is configured to prevent tarnishing or degradation of Ag-containing components, for example, layer 68. Emission area 54 can comprise a first layer of phosphor containing encapsulant 28 as denoted by the shaded or speckled appearance, and a second optically transparent or clear barrier layer 30 adapted to improve chemical and physical resistance.

Emission area 54 can comprise a second layer of filling material at least partially disposed above and/or below the phosphor containing encapsulant layer 28. The second layer of filling material can comprise clear barrier layer 30 (FIGS. 6, 7) of material adapted to improve light output by increasing light extraction efficiency. As previously disclosed and in one aspect, clear barrier layer 30 can comprise a substantially flat piece of glass or glass material including but not limited to silica based or silica containing glasses, fluoride containing glasses, aluminosilicates, phosphate containing glasses, borate containing glasses, chalcogenide glasses, glass-ceramic materials, acrylic glasses, polycarbonate materials, polyethylene terephthalate materials, polymer glasses, soda lime glasses, borosilicate glasses, and/or combinations thereof. In other aspects, clear barrier layer 30 can comprise any other solid non-crystalline material and preferably optically clear material that has been cut and/or dimensionally sized to cover encapsulant layer 28. Notably, clear barrier layer 30 can also be adapted to improve light output by increasing light extraction efficiency. In one aspect, addition of clear barrier layer 30 within device 50 can improve the luminous flux by approximately 1% or more (e.g., see FIG. 8. In other aspects, addition of clear barrier layer 30 within device 50 can improve the luminous flux by approximately 2% or more, and even by approximately 5% or more.

LED chips 22 can comprise any suitable size and/or shape of chip and can be vertically structured (e.g., electrical contacts on opposing sides) and/or horizontally structured (e.g., contacts on the same side or surface). LED chips 22 can comprise any style of chip for example, straight cut and/or bevel cut chips, a sapphire, SiC, or GaN growth substrate or no substrate. One or more LED chips 22 can form a multi-chip array of LED chips 22 electrically connected to each other and/or electrically conductive traces in combinations of series and parallel configurations. In one aspect, LED chips 22 can be arranged in one or more strings of LED chips, where each string can comprise more than one LED chip electrically connected in series. Strings of LED chips 22 can be electrically connected in parallel to other strings of LED chips 22. Strings of LED chips 22 can be arranged in one or more pattern (not shown). LED chips 22 can be electrically connected to other LEDs in series, parallel, and/or combinations of series and parallel arrangements depending upon the application.

Referring to FIG. 5, light emitter device 50 can further comprise at least one opening or hole, generally designated 58, that can be disposed through or at least partially through submount 52 for facilitating attachment of light emitter device 50 to an external substrate, circuit, or surface. For example, one or more screws can be inserted through the at least one hole 58 for securing device 50 to another member, structure, or substrate. Light emitter device 50 can also comprise one or more electrical attachment surfaces 60. In one aspect, attachment surfaces 60 comprise electrical contacts such as solder contacts or connectors. Attachment surfaces 60 can be any suitable configuration, size, shape and/or location and can comprise positive and negative electrode terminals, denoted by the "+" and/or "−" signs on respective sides of device 50, through which an electrical current or signal can pass when connected to an external power source.

One or more external electrically conductive wires (not shown) can be physically and electrically attached to attachment surfaces 60 via welding, soldering, clamping, crimping, inserting, or using any other suitable gas-tight solder free attachment method known in the art. That is, in some aspects, attachment surfaces 60 can comprise devices configured to clamp, crimp, or otherwise attach to external wires (not shown). Electrical current or signal can pass into light emitter device 50 from the external wires electrically connected to device 50 at the attachment surfaces 60. Electrical current can flow into the emission area 54 to facilitate light output from the LED chips 22 disposed therein (FIGS. 6, 7). Attachment surfaces 60 can electrically communicate with LED chips 22 of emission area 54 via conductive traces 64 and 66 (FIGS. 6, 7). That is, in one aspect attachment surfaces 60 can comprise a same layer of material as first and second conductive traces 64 and 66 (FIGS. 6, 7) and therefore can electrically communicate to LED chips 22 attached to traces 64 and 66 via electrical connectors such as wire bonds 24. Electrical connectors can comprise wire bonds 24 or other suitable members for electrically connecting LED chips 22 to first and second conductive traces 64 and 66 (FIGS. 6, 7). That is, in one aspect LED chips 22 (FIGS. 6, 7) can comprise horizontally structured devices having both electrical contacts (e.g., anode and cathode) on the same top surface of respective LED chip 22 such that the contacts (e.g., bond pads) can electrically connect with traces (e.g., 64 and 66, FIGS. 6, 7) via wire bonds 24. In other aspects, LED chips 22 can comprise horizontal devices having both electrical contacts (e.g., anode and cathode) on a bottom surface such that wire bonds 24 are unnecessary. In further aspects, LED chips 22 can comprise vertical devices having electrical contacts on opposing sides such that one wire bond 24 is needed. Any type or structure of LED chip 22 is contemplated herein.

As shown in FIG. 6, the first layer of filling material can comprise an encapsulant layer 28 that can be disposed between inner walls of retention material 56. Encapsulant layer 28 can comprise a predetermined, or selective, amount of one or more phosphors and/or lumiphors in an amount suitable for any desired light emission, for example, suitable for white light conversion or any given color temperature or color point. Encapsulant layer 28 can comprise a silicone encapsulant material, such as a phenyl or methyl silicone having the one or more phosphors disposed therein. Encapsulant layer 28 can interact with light emitted from the plurality of LED chips 22 such that a perceived white light, or any suitable and/or desirable wavelength of light, can be observed. Any suitable combination of encapsulant and/or phosphors can be used, and combinations of differently colored phosphors and/or LED chips 22 can be used for producing any desired color points(s) of light. Retention material 56 can be adapted for dispensing, positioning, damming, or placing, about at least a portion of emission area 54.

Notably, light emitter device 50 can further comprise at least a second layer of filling material at least partially disposed above and/or below the phosphor containing encapsulant layer 28. The second layer of filling material can comprise a discrete layer of the previously described optically clear barrier layer 30 of material adapted to improve chemical and physical resistance of device 50 as well as improve light output by increasing light extraction efficiency. In one aspect, a single clear barrier layer 30 can be disposed above a single encapsulant layer 28 as shown, however, and/or more than one encapsulant layer 28 (e.g., FIG. 3) and one or more clear encapsulant layers (e.g., 80, FIG. 7) are contemplated herein. Clear barrier layer 30 can comprise any suitable material having substantially flat upper and lower surfaces (i.e., flat surfaces disposed adjacent encapsulant layer 28) and can be physically solid in its initial and final forms (e.g., not dispensed). In one aspect, filling material comprised of encapsulant and clear barrier layer 30 can be substantially flush with an upper surface of device 50, that is, an upper surface of retention material 56. In other aspects, clear barrier layer 30 can be substantially flush with and disposed along a same plane of upper surface of device 50 (i.e., substantially flush with and/or disposed along the same plane as upper surface of retention material 56). Clear barrier layer 30 can be at least partially disposed below upper surface of device (e.g., partially disposed below upper surface of retention material 56). In further aspects, clear barrier layer 30 can be entirely disposed below upper surface of device (e.g., entirely disposed below upper surface of retention material 56).

Clear barrier layer 30 can be physically manipulated via cutting, trimming, etching, machining and/or otherwise sized to fit within emission area 54. In one aspect, clear barrier layer 30 fits flush against walls of retention material 56 and preferably is the same length and width dimension and the same geometry as encapsulant layer 28. Clear barrier layer 30 can be thicker and/or thinner than encapsulant layer 28. Clear barrier layer 30 can optionally be coated with phosphoric or lumiphoric materials or any other optical film (not shown). For example only and without limitation, clear barrier layer 30 can comprise a layer of glass, plastic, polymer, or ceramic material configured to conform in size to fit substantially between one or more walls of retention material 56.

In one aspect, clear barrier layer 30 can prevent harmful chemical complexes C from penetrating one or more layers of encapsulant as indicated by the dotted trajectory lines associated with chemical complexes C. In other aspects, clear barrier layer 30 can advantageously prevent physical damage from occurring to LED chips 22 and/or wirebonds 24 within emission area 54 by improving physical resistance of emission area 54. In further aspects, addition of clear barrier layer 30 alone can contribute to improved light output of light emitter device 10 by increasing the overall luminous output of device 50. After placement of retention material 56, phosphor containing encapsulant layer 28 or a clear encapsulant (e.g., 80, FIG. 7) can be selectively filled to any suitable level within the space disposed between one or more inner walls of retention material 56. Clear barrier layer 30 can be placed over encapsulant layer 28, between encapsulant layers 28, and/or between an encapsulant layer 28 and/or clear encapsulant 80 (FIG. 7) and can optionally comprise curved and/or angled sidewalls to substantially fit flush against inner walls of retention material 56.

As illustrated by FIG. 7, a layer of clear encapsulant 80 can optionally be disposed within light emission area 54 either above and/or below clear barrier layer 30. Clear encapsulant 80 can comprise a layer of methyl or phenyl silicone encapsulant through which chemical complexes C may permeate. As such, clear barrier layer 30 can be positioned directly on or over portions of clear encapsulant 80, between one or more portions or layers of clear encapsulant 80, and/or between portions of encapsulant layer 28 and clear encapsulant 80 to prevent such complexes C from damaging Ag or Ag-containing components (e.g., Ag-containing layer 68). For illustration purposes, encapsulant layer 28 is illustrated as comprising the first layer dispensed over LED chips 22 and respective wire bonds 24, clear barrier layer 30 is illustrated as comprising the second or intervening layer, and clear encapsulant 80 is illustrated as comprising the third layer. However, any suitable combination, location, or placement of encapsulant layer 28, clear barrier layer 30, and clear encapsulant 80 is contemplated herein. As illustrated by FIG. 7, the uppermost layer, for example, clear encapsulant 80 can be filled to any level within walls of emission area 54 and can be the same thickness as encapsulant layer 28 or thicker or thinner than encapsulant layer 28. In one aspect, clear encapsulant and/or can be filled to a level substantially flush with an upper surface device 50, for example, an upper surface of retention material 56. In one aspect clear encapsulant 80 can be disposed below clear barrier layer 30 and encapsulant layer 28 could be disposed over clear barrier layer 30. In other aspects, clear encapsulant 80 can be directly adjacent to one or more portions of encapsulant layer 28. More than one layer of clear encapsulant 80 is contemplated herein.

During manufacture of device 50, the first deposited layer (e.g., either encapsulant layer 28 or clear encapsulant 80) can be deposited in emission area 54 first and cured prior to dispensing a subsequent layer (e.g., another encapsulant layer 28 or clear barrier layer 30) such that the subsequently deposited layer can undergo a separate curing step. In other aspects, encapsulant layer 28 and clear barrier layer 30 can be sequentially dispensed in emission area 54, either both before placement of clear barrier layer 30 and/or such that clear barrier layer 30 is positioned therebetween such that encapsulant layer 28 and clear encapsulant 80 can be cured at the same time. That is, multiple dispense and multiple curing steps (i.e., separately dispensing and curing of encapsulant layer 28 and clear encapsulant 80) are contemplated and can be used, or multiple dispense steps and one curing step (i.e., separately dispensing and simultaneous curing of encapsulant layer 28 and clear encapsulant 80) are contemplated and can be used.

FIGS. 6 and 7 further illustrate retention material 56 dispensed or otherwise placed over submount 52 after wire bonding the one or more LED chips 22 such that retention material 56 is disposed over and at least partially covers at least a portion of the wire bonds 24. For example, wire bonds 24 of the outermost edge LED chips in a given set or string of LED chips 22 can be disposed within retention material 14. For illustration purposes, only four LED chips 22 are illustrated and are shown as electrically connected in series via wire bonds 24, however, device can contain many strings of LED chips 22 of any number, for example, less than four or more than four LED chips 22 can be electrically connected in series, parallel, and/or combinations of series and parallel arrangements. Strings of LED chips 22 can comprise diodes of the same and/or different colors, or wavelength bins, and different colors of phosphors can be used in the encapsulant layer 28 disposed over LED chips 22 that are the same or different colors in order to achieve emitted light of a desired color temperature or color point. LED chips 22 can attach to a conductive pad 70 or intervening layers (e.g., layer 68 described below) disposed between LED chip 22 and conductive pad 70 using any die attach technique or materials as known in art and mentioned above, for example adhesive attach, metal or silicone epoxy attach, solder attach, flux-attach, or direct metal-to-metal die attach techniques and materials as known in the art.

LED chips 22 can be arranged, disposed, or mounted over an electrically and/or thermally conductive pad 70. Conductive pad 70 can be electrically and/or thermally conductive and can comprise any suitable electrically and/or thermally conducting material. In one aspect, conductive pad 70 comprises a layer of Cu or a Cu substrate. LED chips 22 can be electrically connected to first and second conductive traces 64 and 66 via optional wire bonds 24. One of first and second conductive traces 64 and 66 can comprise an anode and the other a cathode. Conductive traces 64 and 66 can also comprise a layer of electrically conductive Cu or Cu substrate. In one aspect, conductive pad 70 and traces 64 and 66 can comprise the same Cu substrate from which traces 64 and 66 have been singulated or separated from pad 70 via etching or other removal method.

After etching, an electrically insulating solder mask 72 can be applied such that it is at least partially disposed between conductive pad 70 and respective conductive traces 64 and 66. Solder mask 72 can comprise a white material for reflecting light from light emitter device 50. One or more layers of material can be disposed between LED chips 22 and conductive pad 70. Similarly, one or more layers of material can be disposed over conductive traces 64 and 66. For example and in one aspect, a first intervening layer or substrate of material 68 can be disposed between LED chips 22 and conductive pad 70 and disposed over traces 64 and 66. First layer of material 68 can comprise a layer of reflective Ag or Ag-alloy material for maximizing brightness of light emitted from light emitter device 50. That is, first layer of material 68 can comprise a Ag or Ag-containing substrate adapted to increase brightness of device 50. One or more additional layers of material (not shown) can be disposed between first layer 68 and conductive pad 70 and/or first layer 68 and traces 64 and 66, for example, a layer of Ni can be disposed therebetween for providing a barrier between the Cu of pad and traces 70, 64, and 66 and the Ag of layer 68. Notably, clear barrier layer C can prevent physical and/or chemical damage from occurring to Ag or Ag-containing substrates (e.g., layer 68) disposed within device 50 thereby improving physical and chemical resistance of device 50.

FIGS. 6 and 7 further illustrate a cross-section of submount 52 over which LED chips 22 can be mounted or otherwise arranged. Submount 52 can comprise, for example, conductive pad 70, first and second conductive traces 64 and 66, and solder mask 72 at least partially disposed between conductive pad 70 and each of conductive traces 64 and/or 66. Conductive traces 64, 66 and conductive pad 70 can be coated with a first layer 68, for example a Ag or Ag-containing layer. Submount 52 can further comprise a dielectric layer 74, and a core layer 76. In one aspect, solder mask 72 can directly adhere to portions of dielectric layer 74. For illustration purposes, submount 52 can comprise a MCPCB, for example, those available and manufactured by The Bergquist Company of Chanhassan, Minn. Any suitable submount 52 can be used, however. Core layer 76 can comprise a conductive metal layer, for example copper or aluminum. Dielectric layer 74 can comprise an electrically insulating but thermally conductive material to assist with heat dissipation through submount 52.

As noted earlier, device 50 can comprise a package which does not require or use any secondary optics to keep harmful elements from degrading conductive pad 70. Notably, devices, components and methods disclosed herein provide for improved chemical resistance and improved chemical properties where zero or minimum loss of brightness occurs, even in the presence of harmful chemicals and can be applicable to any SMD type device or multi-array device disclosed herein. Such improvements can prevent Ag coated components from tarnishing, darkening, corroding, or otherwise degrading.

Figure 8:
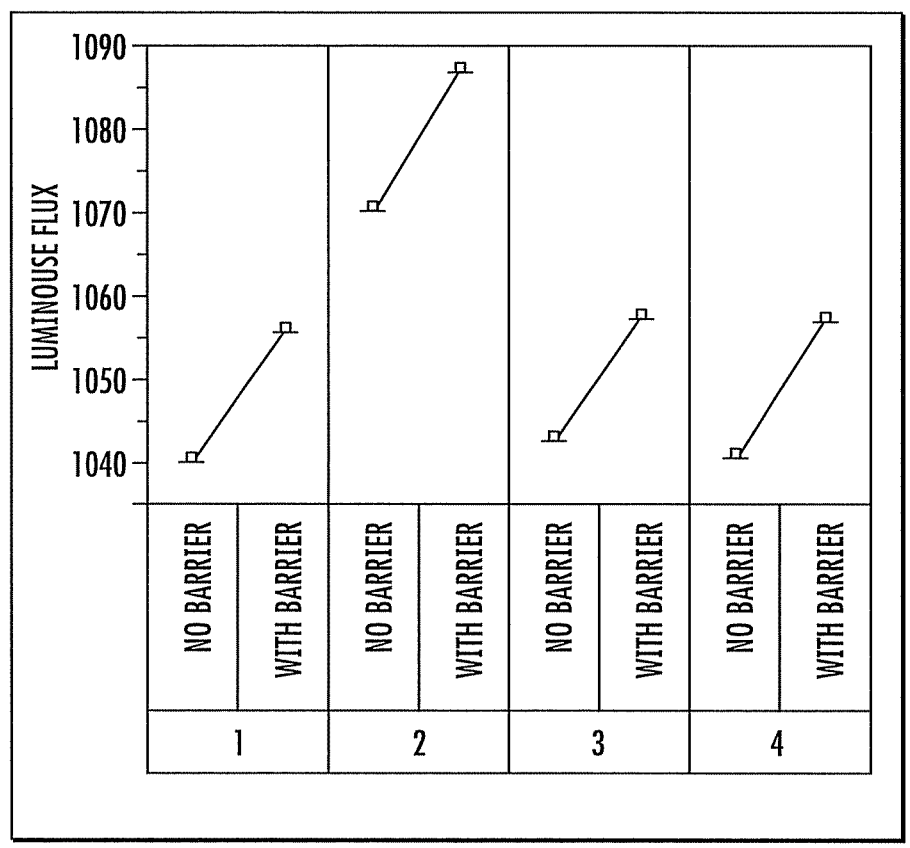
FIG. 8 is a graphical illustration of improved light output for a light emitter device according to the disclosure herein.

FIG. 8 illustrates increases in light output for devices described herein and compares devices which do not have a clear barrier layer 30 (i.e., groups labeled "NO BARRIER") with devices which implement or integrate a clear barrier layer 30 (i.e., groups labeled "WITH BARRIER"). Devices tested included SMD type packages (e.g., devices 10 or 50) as described herein comprising a clear barrier layer 30 of soda lime glass placed over encapsulant layer 28 (e.g., FIG. 6). As FIG. 8 illustrates, luminous flux, or brightness devices comprising an approximately 4000K normal white color temperature can increase by more than approximately 1% when a clear barrier layer 30 is implemented within the device. In some aspects, clear barrier layer 30 increased luminous flux by approximately 1.5% or more (e.g., such as the approximately increase from approximately 1040 lumens (lm) to approximately 1060 lm). However, based upon transmission properties of different glasses, for example and in one aspect transmission properties of borosilicate glass materials, increases in light output of more than approximately 1.5% and even more than approximately 5% are contemplated. As FIG. 8 further illustrates, the improved devices disclosed herein (i.e., within the group "WITH BARRIER") can comprise a light output of approximately 1160 to 1190 lm as compared to devices without a barrier which comprise a light output of approximately 1140 lm. The luminous flux values obtained for FIG. 8 were measured at 270 mA.

Figure 9:
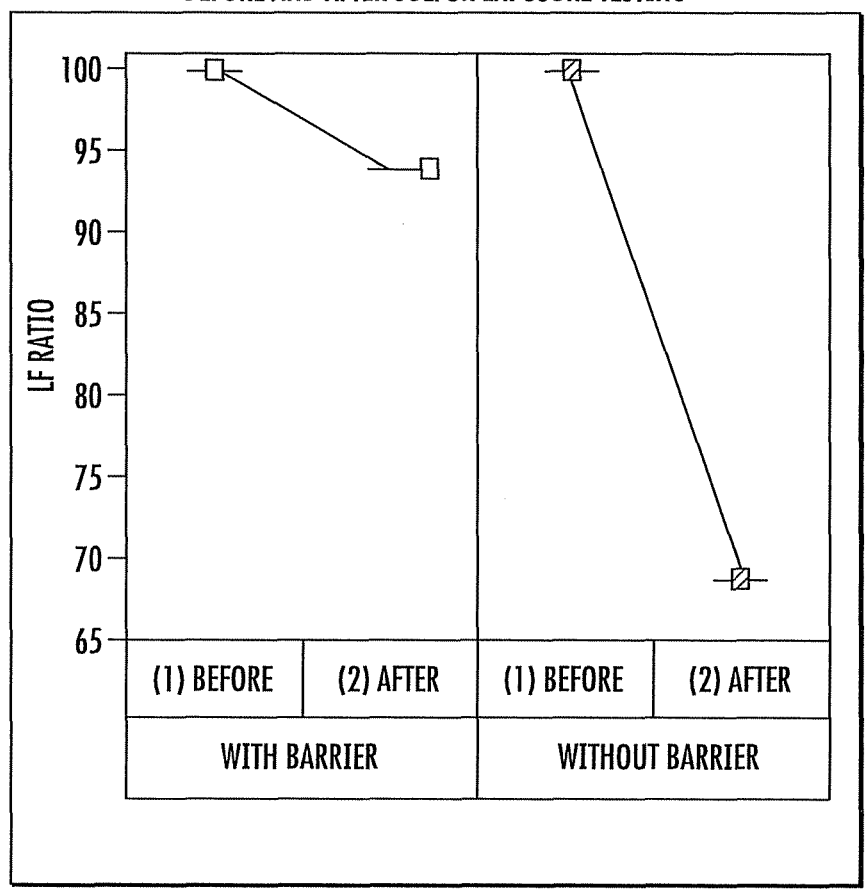
FIG. 9 is a graphical illustration of improved light output for light emitter devices according to the disclosure herein.

FIG. 9 is a graphical illustration of brightness levels, or light output, of devices after exposure to a sulfur environment. As FIG. 9 illustrates, improved devices comprising a clear barrier layer 30 (e.g., group labeled "WITH BARRIER") were measured before exposure to a sulfur environment and after exposure to a sulfur environment. The improved devices retained approximately 95% of initial brightness levels after exposure to a sulfur environment. Devices which did not have a barrier layer only (e.g., group labeled "WITHOUT") retained approximately 70% of brightness levels after exposure to the sulfur environment. The significant loss in brightness can be attributed in part to the darkening or tarnishing of the Ag or Ag-containing components within the emitter device when exposed to a sulfur containing environment (i.e., when sulfur penetrates the silicone encapsulant layer). As FIG. 9 illustrates, clear barrier layer 30 can improve the resistance of device by preventing tarnishing or darkening of Ag-containing components when exposed to harmful chemical complexes, such as sulfur containing vapors or chemical complexes.

Embodiments of the present disclosure shown in the drawings and described above are exemplary of numerous embodiments that can be made within the scope of the appended claims. Devices, components, and methods described herein can advantageously improve chemical resistance to undesirable chemicals and/or chemical vapors within encapsulated emitter devices, while promoting ease of manufacture and increasing device reliability and performance in high power and/or high brightness applications. Described methods can be used and applied to create chemically resistant surface mount device (SMD) type of emitter devices of any size, thickness, and/or dimension. Devices and methods described herein can advantageously be used and adapted within any style of emitter device, for example, devices including a single LED chip, multiple chips, and/or multi-arrays of LED chips. Devices and methods described herein can also advantageously be used and adapted for use with various body or submount materials such as plastic, ceramic, glass, aluminum nitride (AlN), aluminum oxide ($Al_2O_3$), printed circuit board (PCB), metal core printed circuit board (MCPCB), and aluminum panel based devices. It is contemplated that the configurations of light emitter devices having improved light output and related methods can comprise numerous configurations other than those specifically disclosed, including combinations of those specifically disclosed.

What is claimed is:

1. A light emitter device having improved chemical and physical resistance, the light emitter device comprising:
   a light emission area and one or more light emitting chips associated with the light emission area; and
   a filling material at least partially disposed over the one or more light emitting chips, wherein the filling material comprises:
   a first discrete layer of phosphor containing material that comprises a silicone or epoxy material; and
   a second discrete clear barrier layer; and
   a third discrete layer of clear encapsulant;
   wherein the clear barrier layer comprises a layer of glass, wherein the first discrete layer of phosphor containing material is thicker than the second discrete clear barrier layer, and wherein the second discrete clear barrier layer is disposed between the first discrete layer of phosphor containing material and the third discrete layer of clear encapsulant.

2. The device of claim 1, wherein the clear barrier layer comprises at least one of a silica containing glass, a fluoride containing glass, an aluminosilicate, a phosphate containing glass, a borate containing glass, a chalcogenide glass, a glass-ceramic material, an acrylic glass, a polycarbonate material, a polyethylene terephthalate material, a polymer glass, a soda lime glass, and a borosilicate glass.

3. The device of claim 1, wherein the clear barrier layer is at least partially disposed below an upper surface of the light emitter device.

4. The device of claim 1, wherein the clear barrier layer is entirely disposed below an upper surface of the light emitter device.

5. The device of claim 1, further comprising more than one discrete layer of phosphor containing material, and wherein the clear barrier layer is disposed between the more than one discrete layers of phosphor containing material.

6. The device of claim 1, wherein the clear barrier layer comprises a same length and width dimension and a same geometry as the first discrete layer of phosphor containing material.

7. The device of claim 1, wherein the first discrete layer of phosphor containing material is directly on at least a portion of the one or more light emitting chips.

8. The device of claim 1, wherein the third discrete layer of clear encapsulant is directly on at least a portion of the one or more light emitting chips.

9. The device of claim 1, wherein the first discrete layer of phosphor containing material is the same thickness as the third discrete layer of clear encapsulant.

10. The device of claim 1, wherein the device comprises a light output of approximately 1160 to 1190 lm at 270 mA.

11. The device of claim 1, wherein the light emission area is within a cavity.

12. The device of claim 11, wherein the cavity comprises one or more sidewalls adapted to retain the clear barrier layer.

13. The device of claim 12, further comprising a clear fillet disposed between portions of the clear barrier layer and at least one of the sidewalls of the cavity.

14. The device of claim 1, wherein the light emission area is within a cavity comprising one or more sidewalls with projection portions adapted to retain the clear barrier layer.

15. The device of claim 1 wherein the clear barrier layer has a thickness of approximately 0.1 mm or greater.

16. The device of claim 15 wherein the clear barrier layer has a thickness of approximately 0.6 mm or greater.

17. The device of claim 1 wherein the clear barrier layer has a thickness of approximately 0.6 mm or less.

18. The device of claim 15 wherein the light emitter device has a thickness of approximately 1.5 mm or greater.

19. The device of claim 18 wherein the light emitter device has a thickness of approximately 2.0 mm or greater.

20. The device of claim 15 wherein the light emitter device has a thickness of approximately 2.0 mm or less.

21. The device of claim 1 wherein a ratio of thickness of the clear barrier layer to thickness of the light emitter device is approximately 25% or greater.

22. The device of claim 1 wherein a ratio of thickness of the clear barrier layer to thickness of the light emitter device is approximately 30%.

23. The device of claim 15 wherein a ratio of thickness of the clear barrier layer to thickness of the light emitter device is approximately 25% or greater.

24. The device of claim 23 wherein a ratio of the thickness of the clear barrier layer to a thickness of the light emitter device is approximately 30%.

25. The device of claim 15 wherein a ratio of thickness of the clear barrier layer to thickness of the light emitter device is approximately 25% or less.

26. A light emitter device having improved chemical and physical resistance, the light emitter device comprising:
   a light emission area and one or more light emitting chips associated with the light emission area; and
   a filling material at least partially disposed over the one or more light emitting chips, wherein the filling material comprises:
      a first discrete layer of phosphor containing material that comprises a silicone or epoxy material; and
      a second discrete clear barrier layer;
      wherein the clear barrier layer comprises a layer of glass that is substantially flat and substantially the same geometry as the first discrete layer of phosphor containing material, and wherein the first discrete layer of phosphor containing material is thicker than the second discrete clear barrier layer; and
   a clear fillet disposed between portions of the clear barrier layer and a sidewall.

27. The device of claim 26, wherein the clear barrier layer comprises at least one of a silica containing glass, a fluoride containing glass, an aluminosilicate, a phosphate containing glass, a borate containing glass, a chalcogenide glass, a glass-ceramic material, an acrylic glass, a polycarbonate material, a polyethylene terephthalate material, a polymer glass, a soda lime glass, and a borosilicate glass.

28. The device of claim 26, wherein the filling material is filled to a level that is substantially flush with an upper surface of the light emitter device.

29. The device of claim 26, wherein the clear barrier layer is at least partially disposed below an upper surface of the light emitter device.

30. The device of claim 26, wherein the clear barrier layer is entirely disposed below an upper surface of the light emitter device.

31. The device of claim 26, wherein the clear barrier layer is disposed over the first discrete layer of phosphor containing material.

32. The device of claim 26, further comprising more than one discrete layer of phosphor containing material, and wherein the clear barrier layer is disposed between the more than one discrete layers of phosphor containing material.

33. The device of claim 26, wherein the clear barrier layer comprises a same length and width dimension as the first discrete layer of phosphor containing material.

34. The device of claim 26, further comprising a third discrete layer of clear encapsulant.

35. The device of claim 34, wherein the clear barrier layer is disposed between the first discrete layer of phosphor containing material and the third discrete layer of clear encapsulant.

36. The device of claim 34, wherein the first discrete layer of phosphor containing material is directly on a portion of the one or more light emitting chips.

37. The device of claim 34, wherein the third discrete layer of clear encapsulant is directly on a portion of the one or more light emitting chips.

38. The device of claim 34, wherein the first discrete layer of phosphor containing material is the same thickness as the third discrete layer of clear encapsulant.

39. The device of claim 26, wherein the device comprises a light output of approximately 1160 to 1190 lm at 270 mA.

40. The device of claim 26, comprising a cavity with one or more notched sidewalls adapted to retain the clear barrier layer.

41. The device of claim 40, wherein the cavity comprises one or more sidewalls with projecting portions adapted to retain the clear barrier layer.

42. A method of providing a light emitter device having improved chemical and physical resistance, the method comprising:
   providing a light emission area and one or more light emitting chips associated with the light emission area; and
   dispensing a first discrete layer of phosphor containing material and at least partially over the one or more light emitting chips, wherein the first discrete layer comprises a silicone or epoxy material;
   arranging a clear barrier layer over the first discrete layer of phosphor containing material, wherein the clear barrier layer comprises a layer of glass that is substantially flat and substantially the same geometry as the first discrete layer of phosphor containing material, and wherein the first discrete layer of phosphor containing material is thicker than the second discrete clear barrier layer; and
   dispensing at least one other discrete layer of phosphor containing material, wherein the clear barrier layer is arranged between the discrete layers of phosphor containing material.

43. The method of claim 42, wherein arranging the clear barrier layer comprises arranging at least one layer of a silica containing glass, a fluoride containing glass, an aluminosilicate, a phosphate containing glass, a borate containing glass, a chalcogenide glass, a glass-ceramic material, an acrylic glass, a polycarbonate material, a polyethylene terephthalate material, a polymer glass, a soda lime glass, and a borosilicate glass over the first discrete layer of phosphor containing material.

44. The method of claim 42, wherein arranging the clear barrier layer comprises arranging the clear barrier layer at least partially below an upper surface of the light emitter device.

45. The method of claim 42, wherein arranging the clear barrier layer comprises arranging the clear barrier layer entirely below an upper surface of the light emitter device.

46. The method of claim 42, further comprising sizing the clear barrier layer to the same length and width dimension as the first discrete layer of phosphor containing material.

47. The method of claim 42, further comprising dispensing a third discrete layer of clear encapsulant.

48. The method of claim 47, wherein the clear barrier layer is arranged between the first discrete layer of phosphor containing material and the third discrete layer of clear encapsulant.

49. The method of claim 47, wherein the first discrete layer of phosphor containing material is the same thickness as the third discrete layer of clear encapsulant.

50. The method of claim 42, wherein the filling material is filled to a level that is substantially flush with an upper surface of the light emitter device.

51. The method of claim 42, further comprising dispensing a clear fillet member between portions of the clear barrier layer and a sidewall.

52. The method of claim 42, further comprising notching one or more sidewalls for retaining the clear barrier layer.

53. The method of claim 42, further comprising providing one or more projecting portions extending from one or more sidewalls for retaining the clear barrier layer.

54. A light emitter device having improved chemical and physical resistance, the light emitter device comprising:
   a light emission area and one or more light emitting chips associated with the light emission area; and
   a filling material at least partially disposed over the one or more light emitting chips, wherein the filling material comprises:
      a plurality of discrete layers of phosphor containing material; and
      a discrete clear barrier layer;
      wherein the clear barrier layer comprises a layer of glass, wherein the filling material is filled to a level that is substantially flush with an upper surface of the light emitter device, and wherein the clear barrier layer is disposed between the plurality of discrete layers of phosphor containing material.

\* \* \* \* \*